US011770127B2

(12) United States Patent
Minotani et al.

(10) Patent No.: US 11,770,127 B2
(45) Date of Patent: *Sep. 26, 2023

(54) SELF-CALIBRATION FUNCTION-EQUIPPED AD CONVERTER

(71) Applicant: Nippon Telegraph and Telephone Corporation, Tokyo (JP)

(72) Inventors: Tadashi Minotani, Musashino (JP); Kenichi Matsunaga, Musashino (JP)

(73) Assignee: NIPPON TELEGRAPH AND TELEPHONE CORPORATION, Tokyo (JP)

( * ) Notice: Subject to any disclaimer, the term of this patent is extended or adjusted under 35 U.S.C. 154(b) by 74 days.

This patent is subject to a terminal disclaimer.

(21) Appl. No.: 17/608,106

(22) PCT Filed: May 21, 2019

(86) PCT No.: PCT/JP2019/020097
§ 371 (c)(1),
(2) Date: Nov. 1, 2021

(87) PCT Pub. No.: WO2020/234995
PCT Pub. Date: Nov. 26, 2020

(65) Prior Publication Data
US 2022/0337262 A1 Oct. 20, 2022

(51) Int. Cl.
*H03M 1/10* (2006.01)
*H03M 1/56* (2006.01)
(52) U.S. Cl.
CPC .......... *H03M 1/1023* (2013.01); *H03M 1/10* (2013.01); *H03M 1/56* (2013.01)
(58) Field of Classification Search
CPC ......... H03M 1/1023; H03M 1/56; H03M 1/10
(Continued)

(56) References Cited

U.S. PATENT DOCUMENTS

| 5,117,227 A * | 5/1992 | Goeke | H03M 1/50 341/166 |
| 8,957,794 B2 * | 2/2015 | Verbruggen | H03M 1/06 341/120 |

OTHER PUBLICATIONS

*Overview and Mechanism of A/D Conversion*, MEMEs Support Page-Play with MEMEs!, Sep. 10, 2018 (reading day), http://memes.sakura.ne.ip/memes/?page_id=1120, pp. 1-13.
(Continued)

*Primary Examiner* — Khai M Nguyen
(74) *Attorney, Agent, or Firm* — Workman Nydegger

(57) ABSTRACT

A self-calibration-function-equipped AD converter that does not require a measurement device for calibration includes: a control unit including a calibration control unit configured to control an operation of calibrating the self-calibration-function-equipped AD converter, and a conversion control unit configured to control an operation of converting an input voltage to be subjected to conversion into a digital signal; a reference voltage unit configured to output a reference voltage; and an integration/conversion unit including an integrating unit configured to generate an integration voltage obtained by integrating two or more types of unit voltages, a comparator that has two inputs and is configured to compare the integration voltage and the input voltage or the reference voltage, and a crossbar switch configured to switch a connection depending on whether the integration voltage is to be input to one input of the comparator and the input voltage or the reference voltage is to be input to another input, or the input voltage or the reference voltage is to be input to the one input of the comparator and the integration voltage is to be input to the other input.

8 Claims, 14 Drawing Sheets

(58) Field of Classification Search
USPC .......................................... 341/118, 120, 155
See application file for complete search history.

(56) References Cited

OTHER PUBLICATIONS

Rahul Prakash et al., *Trimming to Improve DAC Accuracy (1/3)*, EDN Japan, Nov. 10, 2016, http://ednjapn.com/edn/articles/1611/08/news012.html, pp. 1-23.
Macnica, Inc., *Back Trick! Realize a Pseudo D / A Converter Using PWM*, MACNICA Online Service, Apr. 21, 2015, https://service.macnica.co.jp/iibrary/107577, pp. 1-5.

\* cited by examiner

Fig. 2(a)  IF POSITIVE CURRENT SOURCE IS CONNECTED
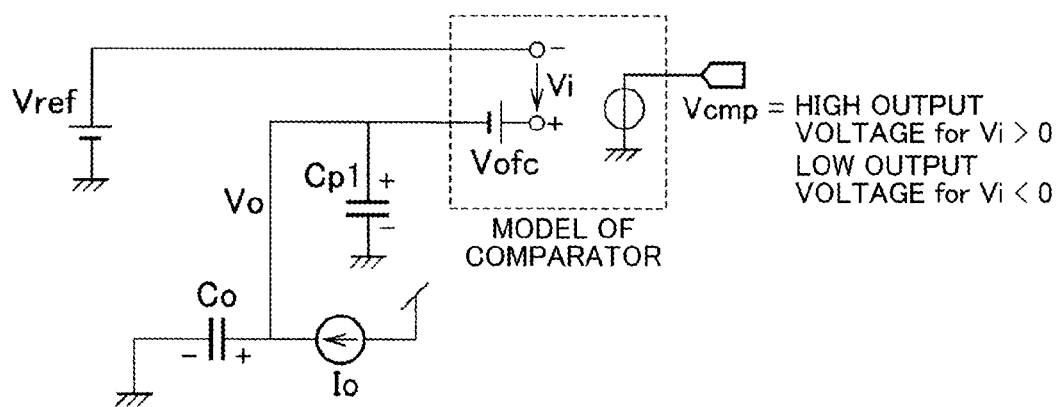
Fig. 2(b)  IF NEGATIVE CURRENT SOURCE IS CONNECTED
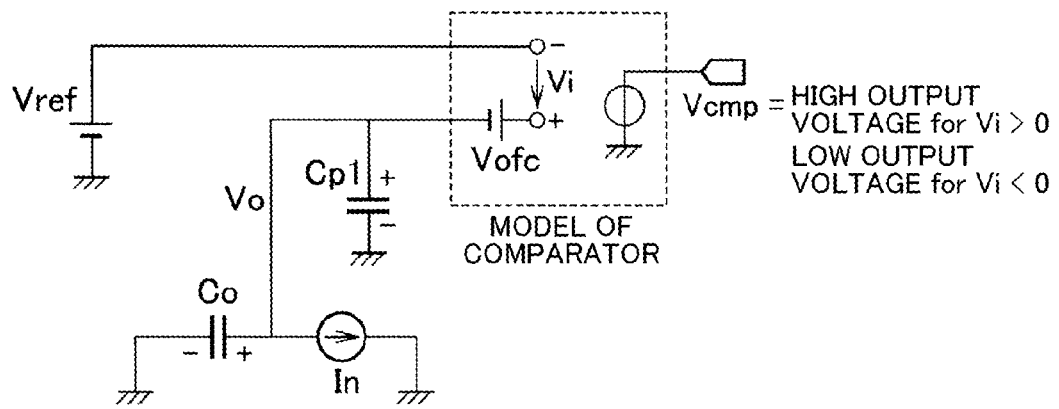

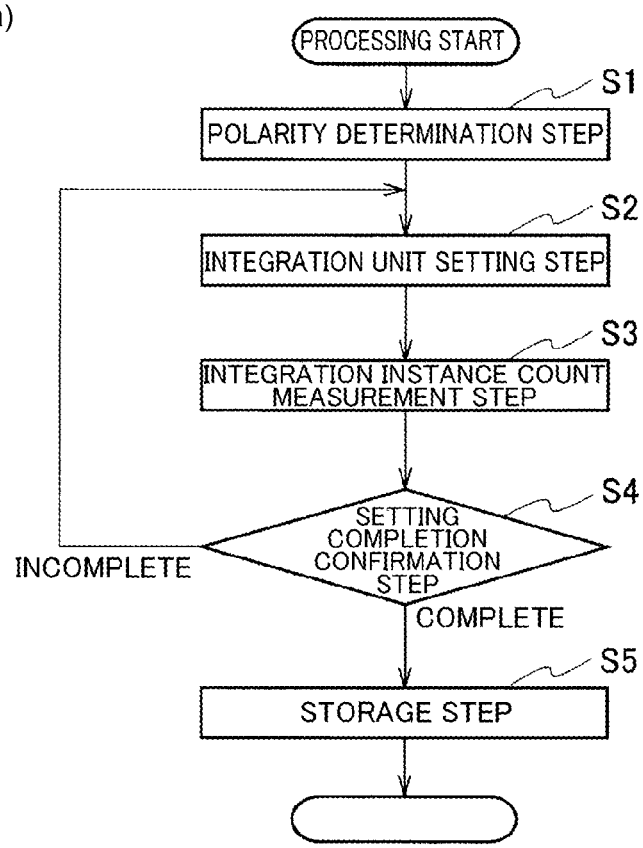

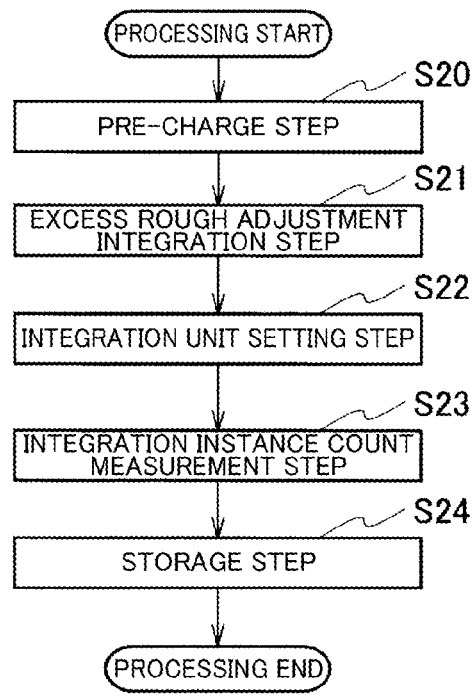

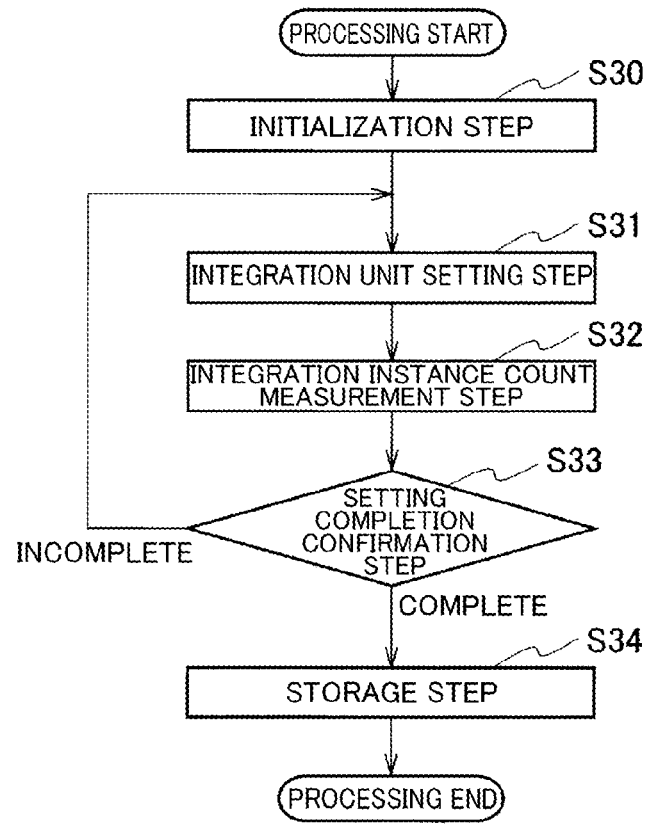

Fig. 8(a)   IF POSITIVE CURRENT SOURCE IS CONNECTED
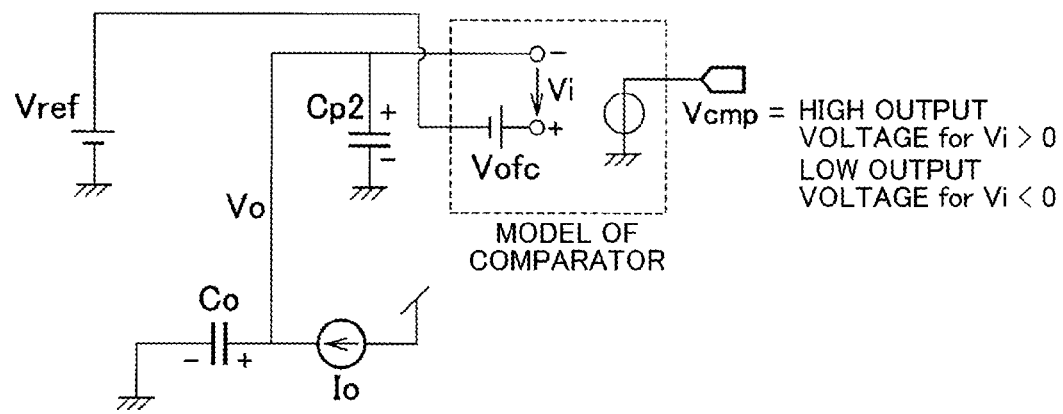
Fig. 8(b)   IF NEGATIVE CURRENT SOURCE IS CONNECTED
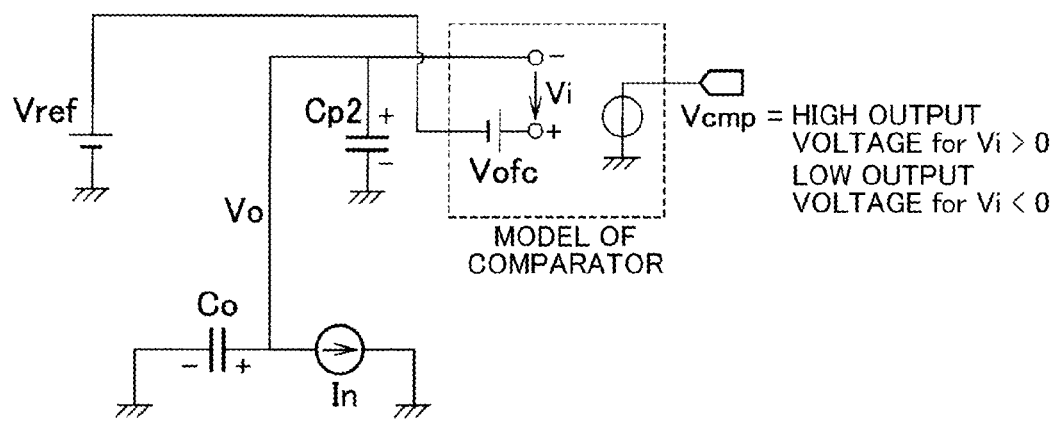

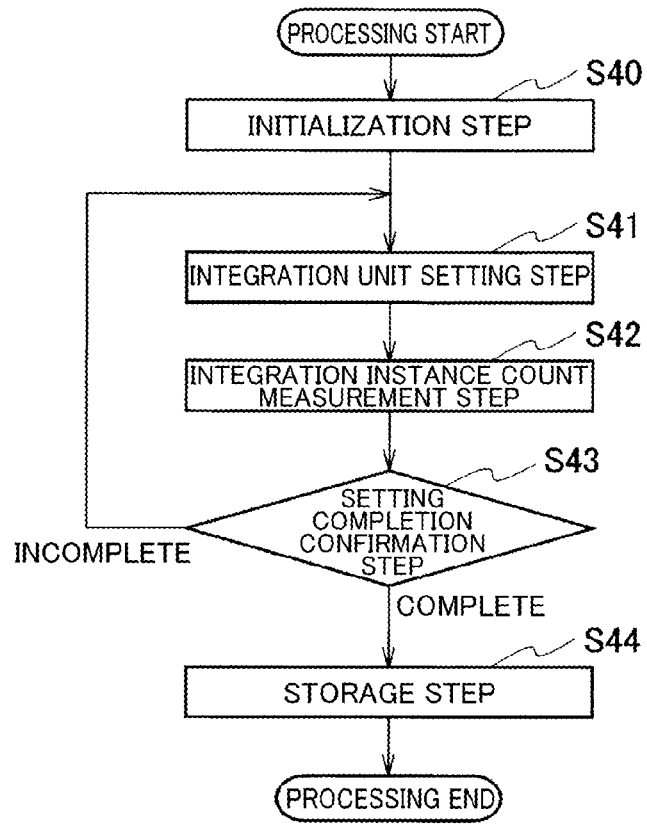

| SETTING ORDER | PARAMETER | SETTING VALUE |
|---|---|---|
| FIRST | INTEGRATION UNIT | ROUGH ADJUSTMENT |
| | POLARITY | POSITIVE |
| SECOND | INTEGRATION UNIT | FINE ADJUSTMENT |
| | POLARITY | NEGATIVE |

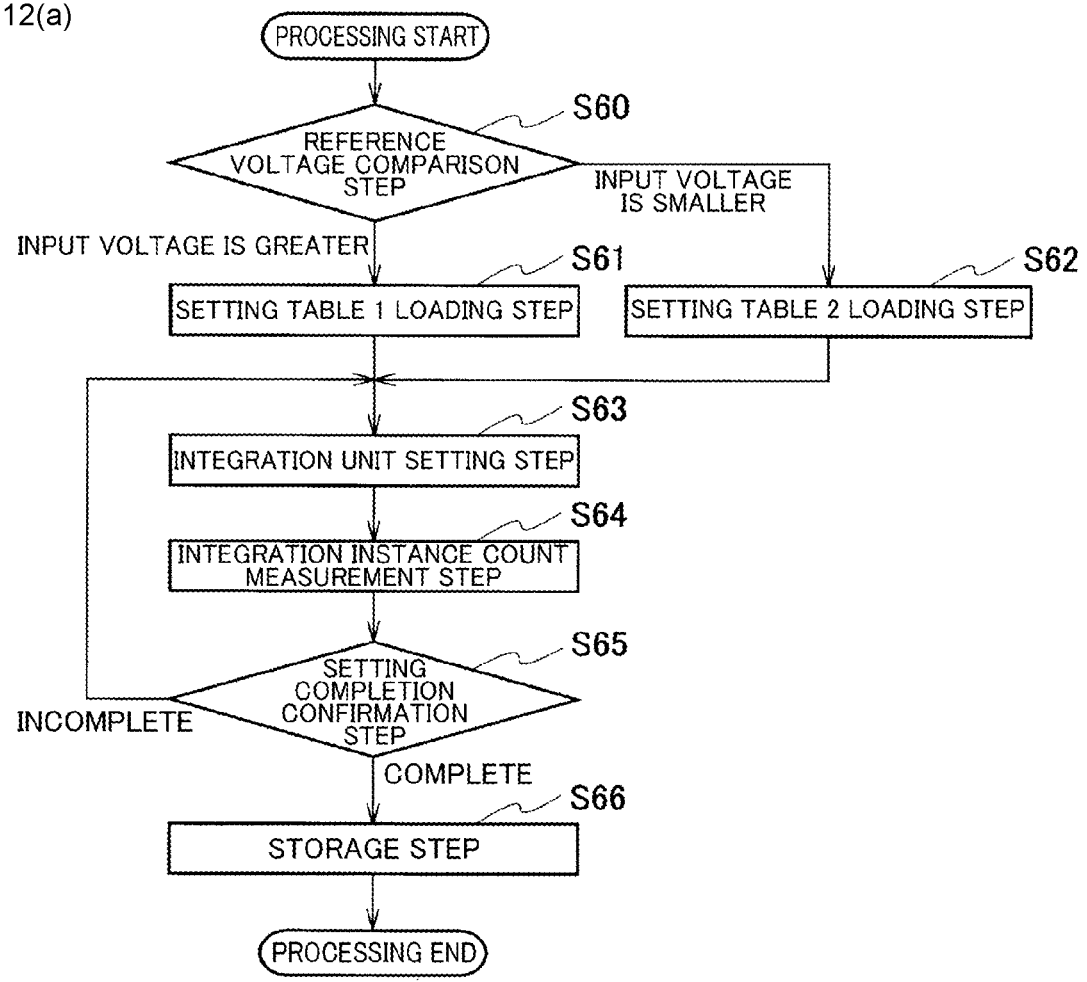

SELF-CALIBRATION FUNCTION-EQUIPPED AD CONVERTER

TECHNICAL FIELD

The present invention relates to a self-calibration-function-equipped AD converter that does not require a measurement device for calibration.

BACKGROUND ART

As is known, an AD converter is constituted by a comparator and a DA converter that outputs a known voltage, and a digital value obtained when the output value of the DA converter is sequentially changed and the smallest output value of the DA converter at which the output of the comparator changes from a low output voltage to a high output voltage is set is used as the conversion value of the AD converter (NPL 1). Variation resulting from change over time in the linearity and the offset of the DA converter leads to change over time in the AD converter.

Representative DA converters include an R-2R ladder circuit, a resistor string circuit (NPL 2), and a PWM (NPL 3). In an R-2R ladder circuit, a high-resolution and high-accuracy variable signal source can be formed with a relatively low number of resistor elements. However, highly-accurate resistors are needed on the MSB side in order to increase the accuracy of output with respect to a setting code.

Although the resistor string circuit has low power consumption and a high monotonic increase property, trial-and-error in the layout design and manufacturing is needed since the linearity of output with respect to a setting code depends on the uniformity and layout of the resistor elements.

A PWM circuit is advantageous in that it has stable performance since a resistor element string is not needed and manufacturing is possible with only a digital circuit, as with an R-2R radar circuit or a resistor string circuit, but design and manufacture with high frequency accuracy are needed in a high-order low-pass filter for removing ripple noise that appears in the output.

Regarding an R-2R radar circuit and a resistor string circuit, it is possible to improve linearity and precision by adjusting the resistor elements and correcting the relationship between the setting code and the output in the final stage of manufacture. However, in this case, adjustment and correction are performed while checking the outputs of the R-2R radar circuit and the resistor string circuit, and therefore a measurement device serving as a reference is needed outside of the circuit.

Note that the offset voltage of the comparator and the unit voltage and the linearity of the DA converter change as time elapses. Accordingly, regular calibration is essential in order to maintain the conversion accuracy over a long period of time (NPL 2).

CITATION LIST

Non-Patent Literature

[NPL 1] Overview and Mechanism of A/D Conversion—MEMEs support page [searched for on May 16, 2019], Internet (URL: http://memes.sakura.ne.jp/memes/?page_id=1120)

[NPL 2] Trimming for Improving Accuracy of DAC (1/3) EDN Japan [searched for on May 16, 2019], Internet (URL: http://ednjapn.com/edn/articles/1611/08/news012.html)

[NPL 3] Secret Trick! Realizing a Virtual D/A Converter Using a PWM [searched for on May 16, 2019], Internet (https://service.macnica.co.jp/library/107577)

SUMMARY OF THE INVENTION

Technical Problem

However, a measurement device serving as a reference is needed outside of the AD converter in order to adjust the offset voltage of the comparator and the unit voltage of the DA converter. For example, a measurement device needs to be brought along in order to calibrate an AD converter arranged at a remote location. Accordingly, there is a problem in that it is difficult to calibrate multiple AD converters at remote locations.

The present invention was made in view of this problem, and aims to provide a self-calibration-function-equipped AD converter, which does not require a measurement device for calibration.

Means for Solving the Problem

A self-calibration-function-equipped AD converter according to an aspect of the present invention is a self-calibration-function-equipped AD converter that does not require a measurement device for calibration, characterized by including: a control unit including a calibration control unit configured to control an operation of calibrating the self-calibration-function-equipped AD converter, and a conversion control unit configured to control an operation of converting an input voltage to be subjected to conversion into a digital signal; a reference voltage unit configured to output a reference voltage; and an integration/conversion unit including an integrating unit configured to generate an integration voltage obtained by integrating two or more types of unit voltages, a comparator that has two inputs and is configured to compare the integration voltage and the input voltage or the reference voltage, and a crossbar switch configured to switch a connection depending on whether the integration voltage is to be input to one input of the comparator and the input voltage or the reference voltage is to be input to another input, or the input voltage or the reference voltage is to be input to the one input of the comparator and the integration voltage is to be input to the other input.

Effects of the Invention

According to the present invention, it is possible to provide a self-calibration-function-equipped AD converter that does not require an external measurement device for calibration.

BRIEF DESCRIPTION OF DRAWINGS

FIGS. 2(a) and 2(b) are diagrams showing an equivalent circuit of an integration unit shown in FIG. 1.

FIGS. 3(a) and 3(b) is a flowchart showing a processing procedure of a polarity determination/offset measurement processing unit shown in FIG. 1.

FIGS. 6(a) and 6(b) is a flowchart showing a processing procedure of an integration unit correlation measurement processing unit shown in FIG. 1.

FIGS. 7(a) and 7(b) is a flowchart showing a processing procedure of an integration unit measurement processing unit shown in FIG. 1.

FIGS. 8(a) and 8(b) are diagrams showing another equivalent circuit of the integration unit shown in FIG. 1.

FIGS. 9(a) and 9(b) is a flowchart showing a processing procedure of a conversion control unit shown in FIG. 1.

FIGS. 12(a)-12(c) is a flowchart showing a processing procedure of a conversion control unit shown in FIG. 10.

DESCRIPTION OF EMBODIMENTS

Figure 1:
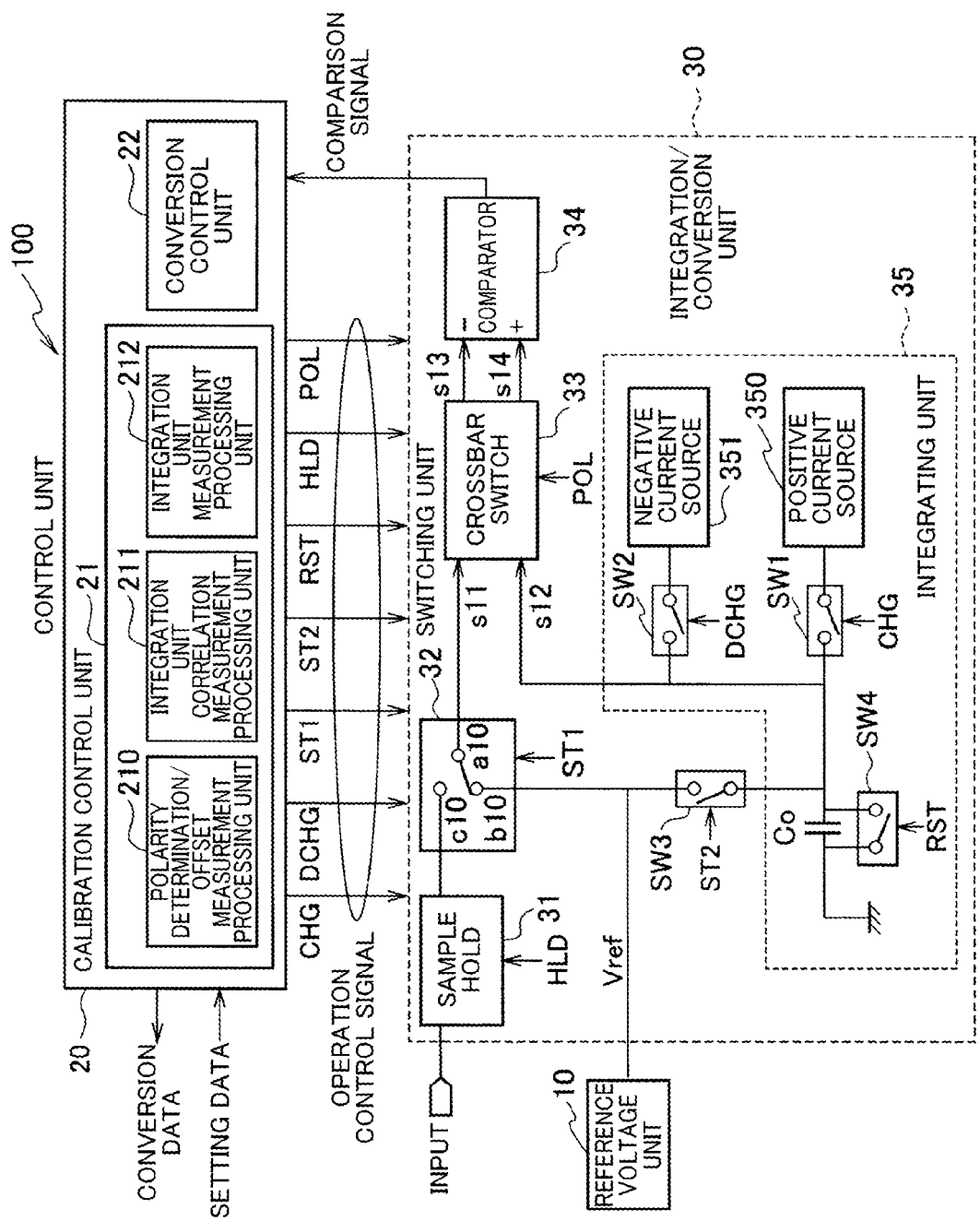
FIG. 1 is a functional block drawing showing an example of a configuration of a self-calibration-function-equipped AD converter according to a first embodiment of the present invention.

Hereinafter, embodiments of the present invention will be described with reference to the drawings. Items that are the same in multiple drawings are denoted by the same reference numerals, and description thereof will not be repeated.

First Embodiment

FIG. 1 is a block diagram showing an example of a configuration of a self-calibration-function-equipped AD converter according to a first embodiment of the present invention. A self-calibration-function-equipped AD converter 100 shown in FIG. 1 is an AD converter that converts an input voltage into a digital value by using a comparator 34 to compare an input voltage and an integration voltage that occurs due to charges that are sequentially accumulated in a capacitor Co. The AD converter is constituted by a reference voltage unit 10, an integration/conversion unit 30, and a control unit 20. Here, the integration/conversion unit 30 includes at least two types of integration units, which are units of the amount of change in the integration voltage of the capacitor Co, calibrates the at least two types of integration units and the offset voltage of the comparator 34 during a calibration state, and compares the input voltage and the integration voltage in order to determine a digital value corresponding to the input voltage in a conversion state. The control unit 20 includes a calibration control unit 21 that implements control of processing for calibrating the integration units of the integration/conversion unit 30 and the offset voltage of the comparator 34 using the calibration control unit 21 in a calibration state, and a conversion control unit 22 that implements control of processing for converting the input voltage into a digital value in the conversion state.

The calibration control unit 21 is constituted by a polarity determination/offset measurement processing unit 210 that determines the polarity of the offset voltage of the comparator 34 and measures the offset voltage, an integration unit correlation measurement processing unit 211 that derives a relational expression for the correlation between the two types of integration units, and an integration unit measurement processing unit 212 that measures the integration units.

The integration/conversion unit 30 is constituted by a sample hold unit 31, a comparator 34, a crossbar switch 33, a switching unit 32, a capacitor Co, a positive current source 350, a negative current source 351, a switch SW1, a switch SW2, a switch SW3, and a switch SW4. The sample hold unit 31 holds an input value. The comparator 34 includes positive and negative inputs, determines that a positive input voltage has exceeded a negative input voltage during a calibration state, and outputs a determination signal. The crossbar switch 33 switches the input to the comparator 34 so as to use the comparator 34 to compare the be repeated integration voltage and the sum of the input voltage or a reference voltage and the offset voltage of the comparator 34, which is positive. The switching unit 32 connects the crossbar switch 33 and a reference voltage source in the calibration state and connects the sample hold unit 31 and the crossbar switch 33 in the conversion state. The capacitor Co generates the integration voltage using the accumulated charge. The positive current source 350 causes charge to be accumulated in the capacitor Co. The negative current source 351 removes the charge accumulated in the capacitor Co. The switch SW1 connects and disconnects the capacitor Co and the positive current source 350. The switch SW2 connects and disconnects the capacitor Co and the negative current source 351. The switch SW3 pre-charges a charge corresponding to the reference voltage in the capacitor Co. The switch SW4 resets the charge accumulated in the capacitor Co. An integrating unit 35 is constituted by the switch SW1, the switch SW2, the switch SW4, the capacitor Co, the positive current source 350, and the negative current source 351.

An integration operation performed in the present embodiment will be described next. Integration is implemented by supplying (or removing) charge from the positive current source 350 (or the negative current source 351) to the capacitor Co for an amount of time that is an integer multiple of a predetermined unit of time. FIG. 2(a) shows an equivalent circuit model in the case where s11 and s13 of the crossbar switch 33 are connected and s12 and s14 of the crossbar switch 33 are connected, and the positive current source 350 and the capacitor Co are connected. In the present equivalent circuit, the electrode connected to the current source side of the capacitor Co is positive (+), and the electrode connected to the ground side of the capacitor Co is negative (−). The offset voltage of the comparator 34 is Vofc. During integration using the positive current source 350, a procedure is repeated in which the switches SW2 to SW4 are set to a disconnected state, and the switch SW1 is set to a connected state for a predetermined amount of time $\Delta t$, and thereafter the switch SW1 is set to a disconnected state. The charge supplied from the positive current source 350 while this is repeated kp times is Ip kp $\Delta t$. With consideration given to a parasitic capacitance Cp1 that is present on the positive input side of the comparator 34, the integration voltage is expressed with the following formula.

Math 1

$$Vo = \frac{Ip}{Co + Cp1} \Delta tkp \quad (1)$$

In the case of integrating using a negative current, a procedure is repeated in which the switches SW1, SW3, and SW4 are set to the disconnected state, the switch SW2 is set to the connected state for a predetermined amount of time Δt, and thereafter the switch SW2 is set to the disconnected state. FIG. 2(b) shows an equivalent circuit used when s11 and s13 of the crossbar switch 33 are connected, s12 and s14 of the crossbar switch 33 are connected, and the negative current source 351 and the capacitor Co are connected. When the switch SW2 has been set to the connected state kn times, the charge In knΔt (In>0) is removed by the negative current source 351 from the charge (Co+Cp1)Vo,0 at a time before connecting the negative current source 351 and the capacitor Co, and therefore the integration voltage is expressed using the following formula.

Math 2

$$Vo = Vo, 0 - \frac{In}{Co + Cp1} \Delta tkn \quad (2)$$

Accordingly, if the integration unit ΔtIp/(Co+Cp1) obtained when connected to the positive current source 350 and the integration unit ΔtIn/(Co+Cp1) obtained when connected to the negative current source 351 are known, the integration voltage can be calculated based on the instance count kp obtained when connected to the positive current source 350 and the instance count kn obtained when connected to the negative current source 351. In the present embodiment, letting Ip>In hold true, the integration unit obtained when connected to the positive current source 350 will be described as a rough adjustment positive integration unit and the integration unit obtained when connected to the negative current source 351 will be described as a fine adjustment negative integration unit. Also, in the description hereinafter, the offset voltage of the comparator 34 will be described as negative (Vofc<0).

In the calibration state of the present embodiment, when a10 and b10 of the switching unit 32 are connected, calibration determination/offset measurement processing, integration unit correlation processing, and integration unit measurement processing are implemented. The processes performed in the calibration state are controlled by the polarity determination/offset measurement processing unit 210, the integration unit correlation measurement processing unit 211, and the integration unit measurement processing unit 212.

FIG. 3 shows processing performed by the polarity determination/offset measurement processing unit 210 and an integration unit and polarity setting table. In the present embodiment, when the calibration determination/offset measurement processing is started, in a polarity determination step S1, the switches SW1, SW2, and SW4 are set to a disconnected state, the switch SW3 is set to a connected state, comparison signals output from the comparator 34 are acquired in a state in which s11 and s13 of the crossbar switch 33 are connected and s12 and s14 of the crossbar switch 33 are connected, and in a state in which s11 and s14 of the crossbar switch 33 are connected and s12 and s13 of the crossbar switch 33 are connected, and the connection state of the crossbar switch 33 is set to a state in which a low-potential voltage is output.

Hereinafter, the connection state of the crossbar switch 33 will not be changed. Since Vofc<0 holds true in the description, after the polarity determination step S1 is complete, s11 and s13 of the crossbar switch 33 are connected and s12 and s14 of the crossbar switch 33 are connected.

Thereafter, the switch SW3 is set to the disconnected state and an integration instance count in which the reference voltage is exceeded is measured. In the calibration determination/offset measurement processing, as described in the integration unit and polarity setting table of FIG. 3(b), first, the integration instance count at which the reference voltage is exceeded is measured using the rough adjustment positive integration unit in which the integration unit is for rough adjustment and the polarity is positive, and then, the integration instance count at which the reference voltage is exceeded is measured using the fine adjustment negative integration unit in which the integration unit is for fine adjustment and the polarity is negative.

Figure 4:
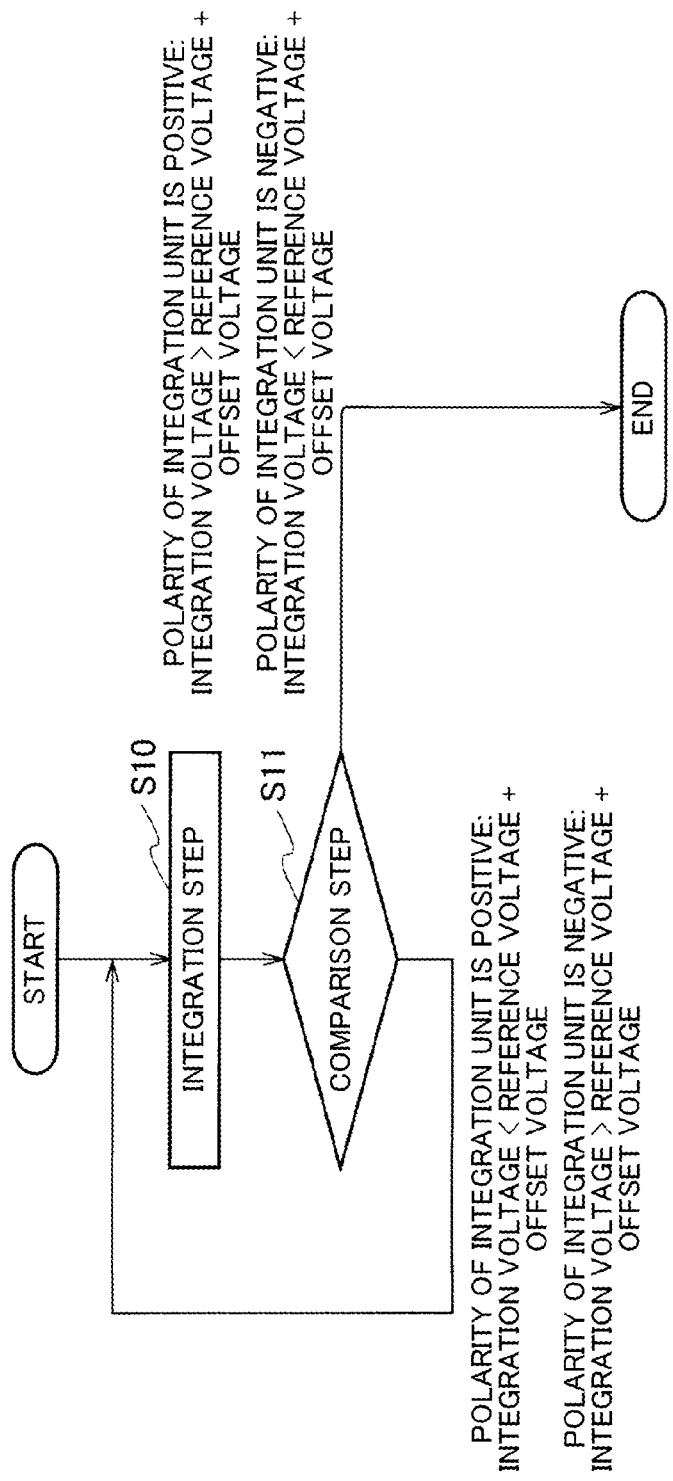
FIG. 4 is a flowchart showing a processing procedure of an integration instance count calculation step.

In an integration unit setting step S2 immediately after the polarity determination step S1, the integrating unit 35 is controlled so as to open and close only the switch SW1 by reading the first integration unit and polarity of the integration unit and polarity setting table. In an integration instance count measurement step S3 that is transitioned to next, integration is repeated until the integration value<the reference value+the offset voltage holds true based on the first polarity of the integration unit and polarity setting table. FIG. 4 shows a processing flow of the integration instance count measurement step S3. In the processing flow, when the polarity of the integration unit is positive, the integration is repeated until the integration voltage>the reference voltage+ the offset voltage holds true, and when the polarity of the integration unit is negative, an integration step S10 and a comparison step S11 is repeated until the integration voltage<the reference voltage+the offset voltage holds true. The magnitude relationship between the integration voltage and the reference voltage+the offset voltage is determined by a comparison signal output from the comparator 34. If the offset voltage Vofc of the comparator 34<0 holds true, the sum of the reference voltage Vref and the offset voltage of the comparator 34 (Vref−Vofc in the formula, since Vofc<0 holds true) and the integration value are input to the comparator 34, and if the sum of the reference voltage and the offset voltage>the integration voltage holds true, a comparison signal with a low-potential voltage is output from the comparator 34. If the sum of the reference voltage and the offset voltage<the integration voltage holds true, the comparison signal is a high-potential voltage, and therefore it is possible to perform the processing of the comparison step of FIG. 4.

After the integration instance count measurement step S3, in a setting completion confirmation step S4, it is confirmed whether or not there is a subsequent setting in the integration unit and polarity setting table, and if there is a subsequent setting, setting is set as being incomplete, and the processing transitions to the integration unit setting step S2. In the case of FIG. 3(b), the integrating unit 35 is set to the fine adjustment negative integration unit. After the integration instance count measurement step S3 with the fine adjustment negative integration unit is complete, in the setting completion confirmation step S4, it is confirmed that there is no subsequent setting in integration unit and polarity setting table, and the processing transitions to the storage step S5.

Figure 5:
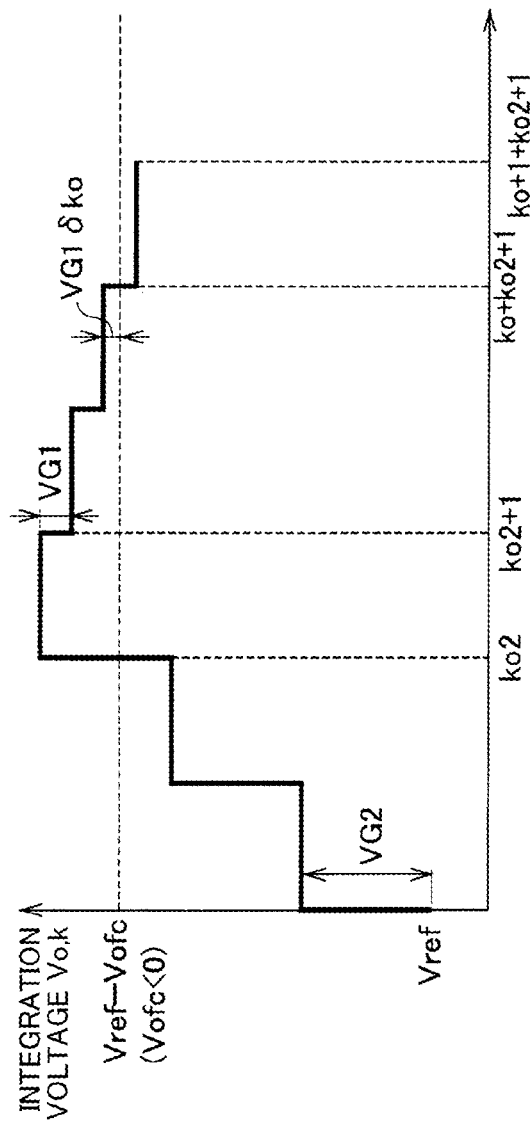
FIG. 5 is a diagram schematically showing a relationship between an integration instance count and an integration voltage.

FIG. 5 shows an example of a relationship between the integration voltage and the integration instance count from when the integration instance count measurement step S3 is transitioned to for the first time in the calibration determination/offset measurement processing to when the storage step S5 is transitioned to. In a comparison step S31 after the ko2+1-th instance of an integration step S30, if it is assumed that the sum of the reference voltage and the offset voltage>the integration voltage holds true, ko2 is defined as a rough adjustment offset integration instance count. Also, after the integration step is started after being set to the fine adjustment negative integration unit, when the sum of the reference voltage and the offset voltage<the integration voltage holds true in the ko+1-th instance, ko is defined as the fine adjustment offset integration instance count. In the storage step S5, ko2 and ko are stored.

The following formula holds true for the integration voltage and the sum of the reference voltage and the offset value using formula (1) and formula (2).

Math 3

$$Vref - Vofc = VGp2(ko2+1) + VGn1(ko+\delta ko) + Vref \quad (3)$$

$$VGp2 = \frac{Ip}{Co+Cp1}\Delta t \quad (4)$$

$$VGn1 = -\frac{In}{Co+Cp1}\Delta t \quad (5)$$

VGp2 in formula (4) indicates a rough adjustment positive integration unit, and VGn1 in formula (5) indicates a fine adjustment negative integration unit. VGn1δko on the right side of formula (3) indicates the difference between the sum of the reference voltage and the offset voltage and the integration voltage immediately before the storage step S5, and δko is a real number that is 0 or more, and less than 1.

FIG. 6 shows a processing flow performed by the integration unit correlation measurement processing unit 211 and the integration unit and polarity setting table. When the integration unit correlation processing is started, in pre-charge processing, the switches SW1, SW2, and SW4 are set to the disconnected state, the switch SW3 is set to the connected state, and a charge corresponding to Vref is pre-charged in the capacitor Co (pre-charge step S20). Thereafter, the switch SW3 is set to the disconnected state, an excess rough adjustment integration step S21 is transitioned to, and the rough adjustment positive integration unit is integrated by the integration instance count obtained by adding, for example, 2 to ko2, which was obtained in the calibration determination/offset measurement processing. The number added to ko2 may any number at long as it is an integer that is 1 or more.

The processing hereinafter is the same as that of the integration unit setting step S2 and onward of the calibration determination/offset measurement processing. Assuming that the sum of the reference voltage and the offset voltage<integration voltage holds true in the kc+1-th instance after the integration step is started for the first time in the integration unit correlation processing, kc is defined as the fine adjustment correlation integration instance count. In the storage step S24, kc is stored.

The following formula holds true in the integration unit correlation processing.

Math 4

$$Vref-Vofc=VGp2(ko2+2)+VGn1(kc+\delta kc)+Vref \quad (6)$$

VGn1δkc on the right side of formula (6) indicates the difference between the sum of the reference voltage and the offset voltage and the integration voltage immediately before the integration step S24, and δkc is a real number that is 0 or more, and less than 1.

FIG. 7 shows a processing flow performed by the integration unit measurement processing unit 212. In the present embodiment, when the integration unit measurement processing is started, in an initialization step S30, the switches SW1 to SW3 are set to the disconnected state, the switch SW4 is set to the connected state and thereafter is set to the disconnected state, and the charge accumulated in the capacitor Co is reset. The processing hereinafter is the same as the processing performed after the integration step is first transitioned to in the calibration determination/offset measurement processing. In the comparison step after the integration step of the ki2+1-th step, if it is assumed that the sum of the reference voltage and the offset voltage>the integration voltage holds true, ki2 is defined as the rough adjustment integration instance count. Also, assuming that the sum of the reference voltage and offset voltage<the integration voltage holds true in the ki+1-th instance after being set to the fine adjustment negative integration unit in the integration unit measurement processing, ki is defined as the fine adjustment integration instance count. In the storage step S34, ki2 and ki are stored.

The following formula holds true in the integration unit measurement processing.

Math 5

$$Vref-Vofc=VGp2(ki2+1)+VGn1(ki+\delta ki) \quad (7)$$

VGn1δki on the right side of formula (7) indicates the sum of the reference voltage and the offset voltage and the integration voltage immediately before the storage step S34, and δki is a real number that is 0 or more, and less than 1.

In order to simplify the expression in the following formula expansion, $Ko=ko+\delta ko$, $Kc=kc+\delta kc$, and $Ki=ki+\delta ki$ are used.

The relational expression between VGn1 and VGp2 can be derived as follows by finding the difference between formula (6) and formula (3).

Math 6

$$0=VGp2+VGn1(Kc-Ko)$$

$$VGp2=-(Kc-Ko)VGn1 \quad (8)$$

When formula (8) is substituted into formula (3), the relational expression between Vofc and VGn1 can be derived.

Math 7

$$Vref-Vofc=-(ko2+1)(Kc-Ko)VGn1+KoVGn1+Vref$$

$$Vofc=(ko2+1)(Kc-Ko)VGn1-KoVGn1 \quad (9)$$

By substituting formulas (8) and (9) into formula (6), the formula for VGn1 is obtained.

Math 8

$$Vref-(ko2+1)(Kc-Ko)VGn1+KoVGn1 = -(ki2+1)(Kc-Ko)VGn1+KiVGn1$$

$$Vref=-(ki2-ko2)(Kc-Ko)VGn1$$

$$VGn1=\frac{-Vref}{(ki2-ko2)(Kc-Ko)-Ki+Ko} \quad (10)$$

By substituting formula (10) into formulas (8) and (9), the formulas for VGp2 and Vofc are obtained.

Math 9

$$VGp2 = \frac{(Kc - Ko)Vref}{(ki2 - ko2)(Kc - Ko) - Ki + Ko} \quad (11)$$

$$Vofc = -\frac{(ko2 + 1)(Kc - Ko) - Ko}{(ki2 - ko2)(Kc - Ko) - Ki + Ko} Vref \quad (12)$$

Normally, Vref>|Vofc| holds true, and therefore ki2>ko2 holds true. Although δki, δkc, and δko included in VGn1, VGp2, and Vofc are real numbers that are 0 or more, and less than 1, their specific values are unclear. Due to the uncertainty of δki, δkc, and δko, the possible values of VGn1, VGp2, and Vofc have ranges. The calibration values of VGn1, VGp2, and Vofc are determined by the median values of the ranges of VGn1, VGp2, and Vofc. When formula (10) is partially differentiated using δki, δkc, and δko, the following formula is obtained.

Math 10

$$\frac{\partial VGn1}{\partial(\delta ki)} = \frac{-Vref}{\{(ki2 - ko2)(Kc - Ko) - Ki + Ko\}^2} < 0 \quad (13)$$

$$\frac{\partial VGn1}{\partial(\delta kc)} = \frac{(ki2 - ko2)Vref}{\{(ki2 - ko2)(Kc - Ko) - Ki + Ko\}^2} > 0 \quad (14)$$

$$\frac{\partial VGn1}{\partial(\delta ko)} = \frac{-(ki2 - ko2) + 1}{\{(ki2 - ko2)(Kc - Ko) - Ki + Ko\}^2} Vref < 0 \quad (15)$$

Due to formulas (13) to (15), VGn1 increases monotonically with respect to δkc and decreases monotonically with respect to δki and δko. Accordingly, the range of VGn1 is expressed using the following formula.

Math 11

$$\frac{-Vref}{(ki2 - ko2)(kc - ko - 1) - ki + ko} < VGn1 < \frac{-Vref}{(ki2 - ko2)(kc - ko + 1) - ki + ko} \quad (16)$$

The calibration value VGn1c of VGn1 is obtained as in the following formula by deriving the median value from formula (16).

Math 12

$$VGn1c = -\frac{Vref}{2} \left\{ \frac{1}{(ki2 - ko2)(kc - ko - 1) - ki + ko} + \frac{1}{(ki2 - ko2)(kc - ko + 1) - ki + ko} \right\} \quad (17)$$

When formula (11) is partially differentiated using δki, δkc, and δko, the following formulas are obtained.

Math 13

$$\frac{\partial VGp2}{\partial(\delta kc)} = \frac{(Kc - Ko)Vref}{\{(ki2 - ko2)(Kc - Ko) - Ki + Ko\}^2} > 0 \quad (18)$$

$$\frac{\partial VGp2}{\partial(\delta kc)} = \frac{-Vref}{(ki2 - ko2)(Kc - Ko) - Ki + Ko} - \frac{(Kc - Ko)\{-(ki2 - ko2) + 1\}Vref}{\{(ki2 - ko2)(Kc - Ko) - Ki + Ko\}^2}$$

$$= \frac{-\{(ki2 - ko2)(Kc - Ko) - Ki + Ko\} + (Kc - Ko)\{(ki2 - ko2) - 1\}}{\{(ki2 - ko2)(Kc - Ko) - Ki + Ko\}^2} Vref$$

$$= \frac{Ki - Ko - (Kc - Ko)}{\{(ki2 - ko2)(Kc - Ko) - Ki + Ko\}^2} Vref = \frac{Ki - Kc}{\{(ki2 - ko2)(Kc - Ko) - Ki + Ko\}^2} Vref < 0 \quad (19)$$

$$\frac{\partial VGp2}{\partial(\delta kc)} = \frac{Vref}{(ki2 - ko2)(Kc - Ko) - Ki + Ko} - \frac{(Kc - Ko)(ki2 - ko2)Vref}{\{(ki2 - ko2)(Kc - Ko) - Ki + Ko\}^2} \quad (20)$$

$$= \frac{(ki2 - ko2)(Kc - Ko) - Ki + Ko - (Kc - Ko)(ki2 - ko2)}{\{(ki2 - ko2)(Kc - Ko) - Ki + Ko\}^2} Vref =$$

$$\frac{-Ki + Ko}{\{(ki2 - ko2)(Kc - Ko) - Ki + Ko\}^2} Vref$$

According to formulas (18) and (19), VGp2 increases monotonically with respect to δki and decreases monotonically with respect to δko. In formula (20), if Ki>Ko holds true, ∂VGp2/∂(δkc)<0 holds true, and if Ki<Ko holds true, ∂VGp2/∂(δkc)>0 holds true. Accordingly, if Ki>Ko holds true, VGp2 decreases monotonically with respect to δkc, and if Ki<Ko holds true, VGp2 increases monotonically with respect to δkc. Due to these relationships, if Ki>Ko holds true, the range of VGp2 is provided using the following formula, and by taking the median value of the range, the calibration value VGp2c in the case where Ki>Ko holds true is formula (22).

Math 14

$$\frac{(kc - ko)Vref}{(ki2 - ko2)(kc - ko) - ki + ko + 1} < VGp2 < \frac{(kc - ko)Vref}{(ki2 - ko2)(kc - ko) - ki + ko - 1} \quad (21)$$

$$VGp2c = \frac{Vref}{2} \left\{ \frac{(kc - ko)}{(ki2 - ko2)(kc - ko) - ki + ko + 1} + \frac{(kc - ko)}{(ki2 - ko2)(kc - ko) - ki + ko - 1} \right\} \quad (22)$$

Also, in the case where Ki<Ko holds true, the range of VGp2 is provided using formula (23), and by taking the median value of the range, the calibration value VGp2c in the case where Ki>Ko holds true is formula (24).

Math 15

$$\frac{(kc-ko-1)Vref}{(ki2-ko2)(kc-ko-1)-ki+ko+1} < VGp2 < \frac{(kc-ko+1)Vref}{(ki2-ko2)(kc-ko+1)-ki+ko-1} \quad (23)$$

$$VGp2c = \frac{Vref}{2}\left\{\frac{(kc-ko-1)}{(ki2-ko2)(kc-ko-1)-ki+ko+1} + \frac{(kc-ko+1)}{(ki2-ko2)(kc-ko+1)-ki+ko-1}\right\} \quad (24)$$

When formula (12) is partially differentiated using δki, δkc, and δko, the following formulas are obtained.

Math 16

$$\frac{\partial Vofc}{\partial(\delta ki)} = -\frac{(ko2+1)(Kc-Ko)-Ko}{\{(ki2-ko2)(Kc-Ko)-Ki+Ko\}^2} < 0 \quad (25)$$

$$\frac{\partial Vofc}{\partial(\delta ko)} = -\frac{-(ko2+1)-1}{(ki2-ko2)(Kc-Ko)-Ki+Ko}Vref +$$

$$\frac{\{(ko2+1)(Kc-Ko)-Ko\}\{-(ki2-ko2)+1\}}{\{(ki2-ko2)(Kc-Ko)-Ki+Ko\}^2}Vref$$

$$= \frac{\{(ko2+1)+1\}\{(ki2-ko2)(Kc-Ko)-Ki+Ko\} + \{(ko2+1)(Kc-Ko)-Ko\}\{-(ki2-ko2)+1\}}{\{(ki2-ko2)(Kc-Ko)-Ki+Ko\}^2}Vref$$

$$= \frac{(ki2-ko2)(Kc-Ko)+(ko2+1)(Kc-Ko)+\{(ko2+1)+1\}\{-Ki+Ko\}+\{-Ko\}\{-(ki2-ko2)+1\}}{\{(ki2-ko2)(Kc-Ko)-Ki+Ko\}^2}Vref$$

$$= \frac{(ki2+1)(Kc-Ko)+\{(ko2+1)+1\}\{-Ki\}+\{Ko\}\{(ki2)+1\}}{\{(ki2-ko2)(Kc-Ko)-Ki+Ko\}^2}$$

$$= \frac{(ki2+1)Kc-(ko2+2)Ki}{\{(ki2-ko2)(Kc-Ko)-Ki+Ko\}^2}Vref > 0 \quad (26)$$

$$\frac{\partial Vofc}{\partial(\delta kc)} = -\frac{(ko2+1)}{(ki2-ko2)(Kc-Ko)-Ki+Ko}Vref +$$

$$\frac{\{(ko2+1)(Kc-Ko)-Ko\}(ki2-ko2)}{\{(ki2-ko2)(Kc-Ko)-Ki+Ko\}^2}Vref$$

$$= \frac{-(ko2+1)\{(ki2-ko2)(Kc-Ko)-Ki+Ko\}+\{(ko2+1)(Kc-Ko)-Ko\}(ki2-ko2)}{\{(ki2-ko2)(Kc-Ko)-Ki+Ko\}^2}Vref$$

$$= \frac{-(ko2+1)\{-Ki+Ko\}+\{-Ko\}(ki2-ko2)}{\{(ki2-ko2)(Kc-Ko)-Ki+Ko\}^2}Vref$$

$$= \frac{(ko2+1)Ki-Ko(ki2+1)}{\{(ki2-ko2)(Kc-Ko)-Ki+Ko\}^2}Vref \quad (27)$$

According to formulas (25) and (26), Vofc decreases monotonically with respect to δki, and increases monotonically with respect to δko. In formula (27), if (ko2+1)Ki>(ki2+1)Ko holds true, ∂Vofc/∂(δkc)>0 holds true, and if (ko2+1)Ki<(ki2+1)Ko holds true, ∂Vofc/∂(δkc)<0 holds true. Due to these relationships, if (ko2+1)Ki>(ki2+1)Ko holds true, the range of Vofc is provided using formula (28), and by taking the median value of the range, the calibration value Vofcc in the case where (ko2+1)Ki>(ki2+1)Ko holds true is formula (29).

Math 17

$$-\frac{(ko2+1)(kc-ko)-ko}{(ki2-ko2)(kc-ko)-ki+ko-1}Vref < Vofc < \quad (28)$$

$$-\frac{(ko2+1)(kc-ko)-ko-1}{(ki2-ko2)(kc-ko)-ki+ko+1}Vref$$

$$Vofcc = -\frac{Vref}{2} \quad (29)$$

$$\left\{\frac{(ko2+1)(kc-ko)-ko}{(ki2-ko2)(kc-ko)-ki+ko-1} + \frac{(ko2+1)(kc-ko)-ko-1}{(ki2-ko2)(kc-ko)-ki+ko+1}\right\}$$

Also, if (ko2+1)Ki<(ki2+1)Ko holds true, the range of Vofc is provided using formula (30), and by taking the median value of the range, the calibration value Vofcc in the case where (ko2+1)Ki<(ki2+1)Ko holds true is formula (31).

Math 18

$$-\frac{(ko2+1)(kc-ko+1)-ko}{(ki2-ko2)(kc-ko+1)-ki+ko-1}Vref < Vofc < \quad (30)$$

$$-\frac{(ko2+1)(kc-ko-1)-ko-1}{(ki2-ko2)(kc-ko-1)-ki+ko+1}Vref$$

$$Vofcc = -\frac{Vref}{2}\left\{\frac{(ko2+1)(kc-ko+1)-ko}{(ki2-ko2)(kc-ko+1)-ki+ko-1} + \quad (31)\right.$$

$$\left.\frac{(ko2+1)(kc-ko-1)-ko-1}{(ki2-ko2)(kc-ko-1)-ki+ko+1}\right\}$$

As indicated in the description above, through the calibration determination/offset measurement processing, the integration unit correlation processing, and the integration unit measurement processing in the calibration state, it is possible to obtain VGn1c, VGp2c, and Vofcc, which are calibration values of the integration units VGn1 and VGp2 and the offset voltage Vofc of the comparator.

Although description was given above for a case in which Vofc<0 holds true, in a case in which Vofc>0 holds true, a low-potential voltage is output from the comparator 34 in a state in which s11 and s14 of the crossbar switch 33 are connected and s12 and s13 of the crossbar switch 33 are connected. For this reason, the calibration determination/offset measurement processing, the integration unit correlation processing, and the integration unit measurement processing thereafter are implemented in a state in which s11 and s14 of the crossbar switch 33 are connected and s12 and s13 of the crossbar switch 33 are connected. The processing flows for the calibration determination/offset measurement processing, the integration unit correlation processing, and the integration unit measurement processing in the case where Vofc>0 holds true are the same as the processing flows shown in FIGS. 3, 6, and 7 respectively.

FIG. 8(a) shows an equivalent circuit model in the case where a positive current source and the capacitor Co are connected in a state in which s11 and s14 of the crossbar switch 33 and s12 and s13 of the crossbar switch 33 are connected. During integration using the positive current source 350, a procedure is repeated in which the switches SW2 to SW4 are set to a disconnected state, and the switch SW1 is set to a connected state for a predetermined amount of time Δt, and thereafter the switch SW1 is set to a disconnected state. The charge supplied from the positive current source when this procedure is repeated kp times is Ip kp Δt. With consideration given to a parasitic capacitance Cp2 that is present on the negative input side of the comparator 34, the integration voltage is expressed with the following formula.

Math 19

$$Vo = \frac{Ip}{Co + Cp2}\Delta tkp \quad (32)$$

In the case of integrating using a negative current, a procedure is repeated in which the switches SW1, SW3, and SW4 are set to the disconnected state, the switch SW2 is set to the connected state for a predetermined amount of time Δt, and thereafter the switch SW2 is set to the disconnected state. FIG. 8(b) shows an equivalent circuit in the case where s11 and s13 of the crossbar switch 33 are connected, s12 and s14 of the crossbar switch 33 are connected, and the negative current source 351 and the capacitor Co are connected. When the switch SW2 has been put in the connected state kn times, the charge of In kn Δt (In>0) is removed by the negative current source 351 from the charge (Co+Cp2)Vo,0 at a time before connecting the negative current source 351 and the capacitor Co, and therefore the integration voltage is expressed using the following formula.

Math 20

$$Vo = Vo, 0 - \frac{In}{Co + Cp2}\Delta tkn \quad (33)$$

Compared to the case where Vofc<0 holds true, which is indicated by formulas (1) and (2), the case where Vofc>0 holds true differs only in that the parasitic capacitance is different due to the input of the comparator 34 being switched by the crossbar switch 33, but otherwise is the same as the case where Vofc<0 holds true. For this reason, the rough adjustment positive integration unit VGp2 and the fine adjustment negative integration unit VGn1 in the case where Vofc>0 holds true follows the following formula.

Math 21

$$VGp2 = \frac{Ip}{Co + Cp2}\Delta t \quad (34)$$

$$VGn1 = -\frac{In}{Co + Cp2}\Delta t \quad (35)$$

The rough adjustment offset integration instance count ko2 and the fine adjustment offset integration instance count ko are obtained through the processing flow performed by the polarity determination/offset measurement processing unit 210 shown in FIG. 3. Since the positive input of the comparator is equivalent to Vref+Vofc and the negative input is the integration voltage based on the equivalent circuit shown in FIG. 7, the following relational expression holds true for ko2, ko, Vref, Vofc, VGn1, and VGp2.

Math 22

$$Vref+Vofc=VGp2(ko2+1)+VGn1(ko+\delta ko)+Vref \quad (36)$$

VGn1δko on the right side of the formula (36) indicates the difference between the sum of the reference voltage and the offset voltage and the integration voltage immediately before the storage step, and δko is a real number that is 0 or more and less than 1.

The fine adjustment correlation integration instance count kc is obtained through the processing flow performed by the integration unit correlation measurement processing unit 211 shown in FIG. 6. The following relational expression holds true for ko2, kc, Vref, Vofc, VGn1, and VGp2.

Math 23

$$Vref+Vofc=VGp2(ko2+2)+VGn1(kc+kc)+Vref \quad (37)$$

VGn1δkc on the right side of formula (37) indicates the difference between the sum of the reference voltage and the offset voltage and the integration voltage immediately before the storage step S34, and δkc is a real number that is 0 or more, and less than 1.

The rough adjustment integration instance count ki2 and the fine adjustment integration instance count ki are obtained through the processing flow performed by the integration unit measurement processing unit shown in FIG. 7. The following relational expression holds true for ki2, ki, Vref, Vofc, VGn1, and VGp2.

Math 24

$$Vref+Vofc=VGp2(ki2+1)+VGn1(ki+\delta ki) \quad (38)$$

VGn1δki on the right side of formula (38) indicates the difference between the sum of the reference voltage and the offset voltage and the integration voltage immediately before the storage step S34, and δki is a real number that is 0 or more, and less than 1.

In order to simplify the expression in the following formula expansion, Ko=ko+δko, Kc=kc+δkc, and Ki=ki+δki are used.

The relational expression between VGn1 and VGp2 can be derived by finding the difference between formulas (37) and (36), the Revivify relational expression between VGn1 and VGp2 follows formula (8) also in the case where Vofc>0 holds true. When formula (8) is substituted for formula (36), the relational expression between Vofc and VGn1 can be derived.

Math 25

$$Vref+Vofc=-(ko2+1)(Kc-Ko)VGn1+KoVGn1+Vref$$

$$Vofc=-(ko2+1)(Kc-Ko)VGn1+KoVGn1 \quad (39)$$

VGn1 in the case where Vofc>0 holds true can be derived by substituting formulas (8) and (39) into formula (38). As a result, VGn1 in the case where Vofc>0 holds true follows formula (10). For this reason, VGp2 in the case where Vofc>0 holds true follows formula (11). Vofc is obtained by substituting formula (10) into formula (39), and is expressed by the following formula.

Math 26

$$Vofc = \frac{(ko2+1)(Kc-Ko)-Ko}{(ki2-ko2)(Kc-Ko)-Ki+Ko}Vref \quad (40)$$

Compared to the case where Vofc<0 holds true, VGn1 and VGp2 are the same, and their absolute values are the same, and only the sign of Vofc is different.

In the case where Vofc>0 holds true as well, similarly to the case where Vofc<0 holds true, the calibration values of VGn1, VGp2, and Vofc are determined by the median values of the ranges of VGn1, VGp2, and Vofc. Since VGn1 in the case where Vofc>0 holds true is the same as in the case where Vofc<0 holds true, the range of VGn1 is indicated by formula (16), and the calibration value VGn1c follows formula (17). Similarly for VGp2 as well, the calibration value VGp2c in the case where Vofc>0 holds true is formula (23) in the case where Ki<Ko holds true, and is formula (24) in the case where Ki>Ko holds true.

Since only the signs are different between Vofc in the case where Vofc>0 and Vofc in the case where Vofc<0, the following formula is obtained when formula (40) is partially differentiated using δki, δkc, and δko.

Math 27

$$\frac{\partial Vofc}{\partial(\delta ki)} = \frac{(ko2+1)(Kc-Ko)-Ko}{\{(ki2-ko2)(Kc-Ko)-Ki+Ko\}^2} Vref > 0 \quad (41)$$

$$\frac{\partial Vofc}{\partial(\delta ki)} = -\frac{(ki2+1)Kc-(ko2+2)Ki}{\{(ki2-ko2)(Kc-Ko)-Ki+Ko\}^2} Vref < 0 \quad (42)$$

$$\frac{\partial Vofc}{\partial(\delta kc)} = \frac{-(ko2+1)Ki+Ko(ki2+1)}{\{(ki2-ko2)(Kc-Ko)-Ki+Ko\}^2} Vref \quad (43)$$

According to formulas (41) and (42), Vofc increases monotonically with respect to δki, and decreases monotonically with respect to δko. In formula (43), if (ko2+1)Ki>(ki2+1)Ko holds true, ∂Vofc/∂(δkc)<0 holds true, and if (ko2+1)Ki<(ki2+1)Ko holds true, ∂Vofc/∂(δkc)>0 holds true. Due to these relationships, if (ko2+1)Ki>(ki2+1)Ko holds true, the range of Vofc is provided using formula (44), and by taking the median value of the range, the calibration value Vofcc in the case where (ko2+1)Ki>(ki2+1)Ko holds true is formula (45).

Math 28

$$\frac{(ko2+1)(kc-ko)-ko-1}{(ki2-ko2)(kc-ko)-ki+ko+1} Vref < Vofc < \quad (44)$$

$$\frac{(ko2+1)(kc-ko)-ko}{(ki2-ko2)(kc-ko)-ki+ko-1} Vref$$

$$Vofcc = \frac{Vref}{2} \quad (45)$$

$$\left\{ \frac{(ko2+1)(kc-ko)-ko-1}{(ki2-ko2)(kc-ko)-ki+ko+1} + \frac{(ko2+1)(kc-ko)-ko}{(ki2-ko2)(kc-ko)-ki+ko-1} \right\}$$

Also, if (ko2+1)Ki<(ki2+1)Ko holds true, the range of Vofc is provided using formula (46), and by taking the median value of the range, the calibration value Vofcc in the case where (ko2+1)Ki<(ki2+1)Ko holds true is formula (47).

Math 29

$$\frac{(ko2+1)(kc-ko-1)-ko-1}{(ki2-ko2)(kc-ko-1)-ki+ko+1} Vref < Vofc < \quad (46)$$

$$\frac{(ko2+1)(kc-ko+1)-ko}{(ki2-ko2)(kc-ko+1)-ki+ko-1} Vref$$

$$Vofcc = \frac{Vref}{2} \left\{ \frac{(ko2+1)(kc-ko-1)-ko-1}{(ki2-ko2)(kc-ko-1)-ki+ko+1} + \quad (47) \right.$$

$$\left. \frac{(ko2+1)(kc-ko+1)-ko}{(ki2-ko2)(kc-ko+1)-ki+ko-1} \right\}$$

As shown in the description above, even if Vofc>0 holds true, VGn1c, VGp2c, and Vofcc, which are the calibration values of the integration units VGn1 and VGp2 and the offset value Vofc of the comparator can be obtained through the calibration determination/offset measurement processing, the integration unit correlation processing, and the integration unit measurement processing in the calibration state.

The processing of the conversion state is controlled by the conversion control unit 22. FIG. 9 shows the processing flow of the conversion control unit 22 and the integration unit and polarity setting table. In the conversion state, the connection of the crossbar switch 33 obtained based on the polarity of Vofc obtained in the calibration determination/offset measurement processing in the calibration state is maintained. In the initialization step S40, a10 and c10 of the switching unit 32 are connected, the input voltage is held in the sample hold unit 31, the switches SW1 to SW3 are disconnected, and the accumulated charge of the capacitor Co is reset through the connection and disconnection of the switch SW4.

The processing thereafter is the same as the integration unit measurement processing other than that the reference voltage of the integration unit measurement processing is the input voltage. A rough adjustment conversion integration instance count kv2 and a fine adjustment conversion integration instance count kv are obtained through this processing. Assuming that the input voltage is Vin, kv2 and kv and the following relational expression holds true.

Math 30

$$Vin+|Vofcc|=VGp2c(kv2+1)+VGn1c(kv+\delta kv) \quad (48)$$

Although Vofcc differs depending on whether Vofc<0 or Vofc>0 holds true, upon consideration of the connection between the polarity of Vofc and the crossbar switch, |Vofcc| is the same in both the case where Vofc<0 holds true and the case where Vofc>0 holds true, and therefore the left side of formula (48) is Vin+|Vofcc|. VGn1cδkv on the right side of formula (48) indicates the difference between the sum of the input voltage and the offset voltage and the integration voltage immediately before the storage step, and δkv is a real number that is 0 or more, and less than 1, but the specific value thereof is unclear. Due to the uncertainty of δkv, the possible values of Vin have a range. The conversion value of Vin is determined by the median value of the range of Vin. The range of Vin is formula (49), and the conversion value Vinc of Vin is indicated in formula (50).

Math 31

$$VGp2c(kv2+1)+VGn1ckv-|Vofcc|<Vin<VGp2c(kv2+1)+VGn1c(kv+1)-|Vofcc| \quad (49)$$

$$Vinc=VGp2c(kv2+1)+VGn1c(kv+\tfrac{1}{2})-|Vofcc| \quad (50)$$

The conversion value Vinc of the input voltage can be obtained using the calibration values VGn1c, VGp2c, and Vofcc obtained in the calibration state through the above-described processing of the conversion control unit 22.

According to the embodiment indicated in the above description, even if the capacitance and the like forming the offset of the comparator 34 and the integration unit fluctuates due to change over time, it is possible to calibrate the offset of the comparator 34 and the integrating unit 35, which is the analog value output unit of the DA converter, and it is possible to provide an AD converter with high long-term stability.

The integration unit need only be made smaller in order to increase the accuracy of the calibration value. However, in the case of using only one type of integration value, when the integration unit is made smaller in order to increase the accuracy, the number of instances of integration in the processing in the calibration state will increase, and the amount of time needed for processing will increase. By providing two types of integration units, namely a rough processing integration unit and a fine processing integration unit, as in the present embodiment, it is possible to integrate the integration values with a lower integration instance count and a higher accuracy up to a reference voltage or an input voltage, compared to the case of performing integration using only a small integration unit. Accordingly, the calibration processing and the conversion processing can be implemented with a smaller integration instance count and a higher accuracy compared to the case where integration is performed using only a small integration unit.

Figure 10:
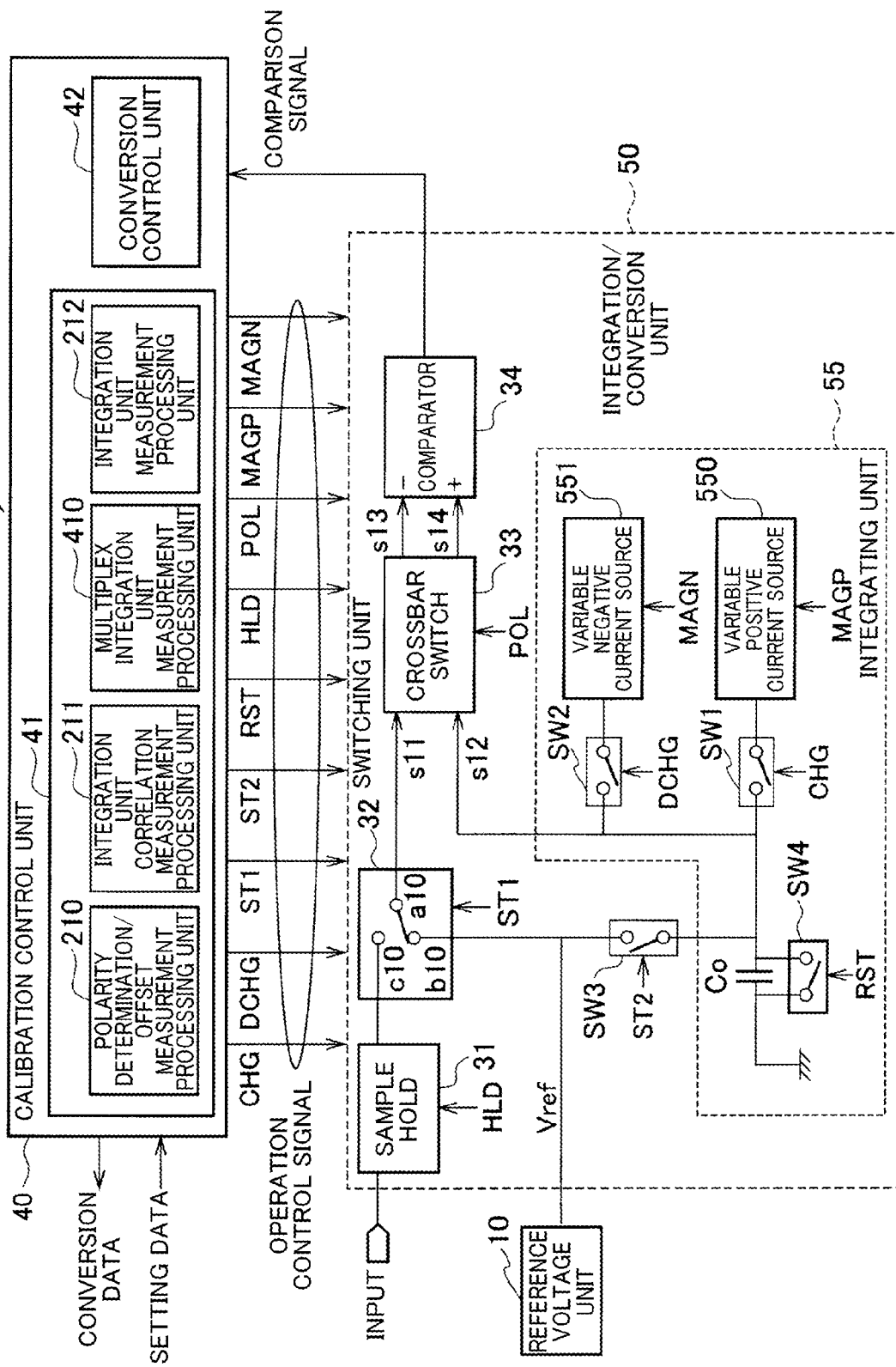
FIG. 10 is a functional block diagram showing an example of a configuration of a variation of the self-calibration-function-equipped AD converter shown in FIG. 1.

FIG. 10 shows a variation of the first embodiment. A self-calibration-function-equipped AD converter 200 shown in FIG. 10 differs from the above-described first embodiment in that an integrating unit 55 that uses a variable positive current source 550 has been added, and a variable negative current source 551, and a multiplex integration unit measurement processing unit 410 has been added to the calibration control unit 41. Also, the processing flow performed by the conversion control unit 42 is different.

In the variable positive current source 550, a current that generates two types of integration units, namely, a rough adjustment positive integration unit and a fine adjustment positive integration unit, that increase the integration voltage, and that generates the rough adjustment positive integration unit and the fine adjustment positive integration unit using a signal MAGP from the control unit is set. In the variable negative current source 551, a current that generates two types of integration units, namely, a rough adjustment negative integration unit and a fine adjustment negative integration unit, which reduce the integration voltage, and that generates the rough adjustment negative integration unit and the fine adjustment negative integration unit using a signal MAGN from the control unit 40 is set.

In the following description, VGp2 is the rough adjustment positive integration unit, VGp1 is the fine adjustment positive integration unit, VGn2 is the rough adjustment negative integration unit, and VGn1 is the fine adjustment negative integration unit.

In the calibration state, the calibration determination/offset measurement processing, the integration unit correlation processing, the multiplex integration unit measurement processing, and the integration unit measurement processing are respectively implemented by the polarity determination/offset measurement processing unit 210, the integration unit correlation measurement processing unit 211, the multiplex integration unit measurement processing unit 410, and the integration unit measurement processing unit 212 of the calibration control unit 41.

In a state in which the rough adjustment positive integration unit VGp2 has been generated by setting the variable positive current source 550 and the fine adjustment negative integration unit VG1n has been generated by setting the variable negative current source 551, the calibration determination/offset measurement processing and the integration unit correlation measurement processing are implemented. These processes are the same as in the case of FIG. 1, and therefore will be omitted. Due to these processes, the rough adjustment offset integration instance count ko2, the fine adjustment offset integration instance count ko, and the fine adjustment correlation integration instance count kc, for which the relational expressions of formulas (3) and (6) hold true if Vofc<0 holds true and the relational expressions of formulas (36) and (37) hold true if Vofc>0 holds true, are obtained.

Figures 11A, 11B:
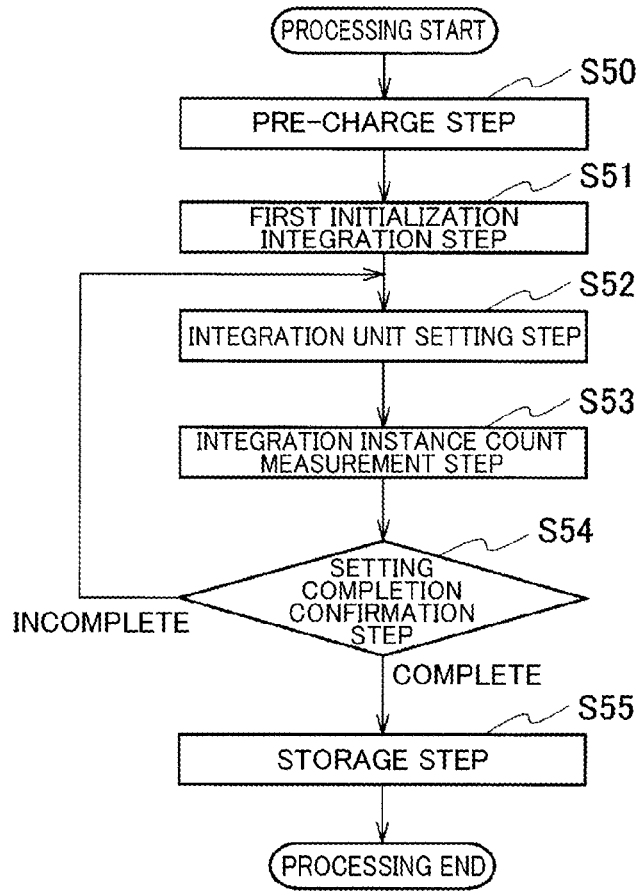
FIGS. 11(a) and 11(b) is a flowchart showing a processing procedure of a multiplex integration unit measurement processing unit shown in FIG. 10.

FIG. 11 shows a processing flow performed by the multiplex integration unit measurement processing unit 410. When the multiplex integration unit measurement processing is started, the switches SW1, SW2, and SW4 are disconnected, the switch SW3 is connected, the capacitor Co is pre-charged, and the initial value of the integration voltage is a reference voltage Vref (step S50). Thereafter, the switch SW3 is disconnected, and in the first integration step S51, the variable positive current source is set to generate the rough adjustment negative integration unit VGn2, and ke2 VGn2 is removed from the integration voltage by connecting and disconnecting the switch SW2 ke2 times, which is a predetermined instance count determined in advance. Thereafter, processing that is the same as in the integration unit setting step and onward of the calibration determination/offset measurement processing is implemented.

Assuming that the reference voltage+the offset voltage>the integration voltage holds true in the ke2+1-th instance of the integration step, ke2 is defined as the second rough adjustment negative coefficient integration instance count. Assuming that the sum of the reference voltage and the offset voltage<the integration voltage in the ke+1-th instance of the calculation step after being set to the fine adjustment negative integration unit, ke is defined as the first rough adjustment negative coefficient integration instance count. In the storage step S55, ke is stored. Regarding ke, in the case where Vofc<0 holds true, the following formula holds true.

Math 32

$$Vref-Vofc=(kp2+1)VGp2+ke2VGn2+(ke+\delta ke)VGn1+Vref \quad (51)$$

VGn1δke on the right side in formula (51) indicates the difference between the sum of the reference voltage and the offset voltage and the integration voltage immediately before the storage step, and δke is a real number that is 0 or more, and less than 1.

In the case where Vofc>0 holds true, the following formula (52) holds true.

Math 33

$$Vref+Vofc=(kp2+1)VGp2+ke2VGn2+(ke+\delta ke)VGn1+Vref \quad (52)$$

The integration unit measurement processing is implemented in a state in which the variable positive current source 550 has been set to generate the rough adjustment positive integration unit VGp2, and the variable negative current source 551 has been set to generate the fine adjustment negative integration unit VG1n. This processing is the same as in the case of FIG. 1, and therefore will be omitted. According to this processing, the rough adjustment integration instance count ki2 and the fine adjustment integration instance count ki, for which the relational expression of formula (7) holds true if Vofc<0 holds true and the relational expression of formula (38) holds true if Vofc>0 holds true, are obtained.

Since the relational expressions of VGp2, VGn1, and Vofc, and ko2, ko, kc, ki2, and ki1 are the same as in the case of the embodiment shown in FIG. 1, the calibration values of VGp2, VGn1, and Vofc are the same as the calibration values derives in the embodiment shown in FIG. 1.

Regarding VGn2, in the case where Vofc<0 holds true, the difference between formula (51) and formula (3) is found, formula (10) is substituted for formula (8), and the following formula (53) is obtained.

Math 34

$$0 = (kp2 - ko2)\ VGp2 + ke2\ VGn2 + (Ke - Ko)VGn1 \quad (53)$$
$$ke2\ VGn2 = (kp2 - ko2)\ (Kc - Ko)VGn1 - (Ke - Ko)VGn1$$
$$VGn2 = \frac{(kp2 - ko2)(Kc - Ko) - (Ke - Ko)}{ke2} VGn1$$

In formula (53), Ko=ko+δko, Kc=kc+δkc, and Ke=ke+δke hold true.

Although δkc, δko, and δke, which are included in VGn2, are real numbers that are 0 or more, and less than 1, their specific values are unclear. Due to the uncertainty of δkc, δko, and δke, there is a range of possible values of VGn2. The calibration value of VGn2 is determined by the median value of the range of VGn2. Also, the calibration value VGn1c is used as VGn1. When formula (53) is partially differentiated using δkc, δko, and δke, the following formulas are obtained.

Math 35

$$\frac{\partial VGn2}{\partial (\delta ke)} = \frac{-1}{ke2} VGn1c > 0 \quad (54)$$

$$\frac{\partial VGn2}{\partial (\delta kc)} = \frac{(kp2 - ko2)}{ke2} VGn1c < 0 \quad (55)$$

$$\frac{\partial VGn2}{\partial (\delta ko)} = \frac{-(kp2 - ko2) + 1}{ke2} VGn1c > 0 \quad (56)$$

VGn1c<0 and kp2>ko2 are used in the derivation of the inequality sign in the formula above. According to formula (54) and (56), VGn2 increases monotonically with respect to δke and δko, and decreases monotonically with respect to δkc. For this reason, the range of VGn2 is formula (57), and by taking the median value thereof, the calibration value VGn2c is indicated by formula (58).

Math 36

$$\frac{(kp2 - ko2)(kc - ko + 1) - (ke - ko)}{ke2} VGn1c < VGn2 < \quad (57)$$
$$\frac{(kp2 - ko2)(kc - ko - 1) - (ke - ko)}{ke2} VGn1c$$

$$VGn2c = \frac{VGn1c}{2} \left\{ \frac{(kp2 - ko2)(kc - ko - 1) - (ke - ko)}{ke2} + \frac{(kp2 - ko2)(kc - ko + 1) - (ke - ko)}{ke2} \right\} \quad (58)$$

As indicated in the description above, VGn1c, VGp2c, VGn2c, and Vofcc, which are calibration values of the integration units VGn1, VGp2, and VGn2, and the offset voltage Vofc of the comparator, can be obtained through the calibration determination/offset measurement processing, the integration unit correlation processing, the multiplex integration unit measurement processing, and the integration unit measurement processing in the calibration state.

FIG. 12 shows a processing flow of the conversion control unit that is implemented in the conversion state. In the present embodiment, in the conversion state, the connection of the crossbar switch 33 obtained based on the polarity of Vofc obtained in the calibration determination/offset measurement processing in the conversion state is maintained. When the processing of the conversion control unit 42 is started, in a reference voltage comparison step S60, a10 and c10 of the switching unit 32 are connected, the input voltage is held in the sample hold unit 31, the switches SW1, SW2, and SW4 are disconnected, and the capacitor Co is precharged with a charge corresponding to the reference voltage through connection of the switch SW3. Thereafter, the input voltage and the reference voltage held in the sample hold unit 31 are compared by the comparator 34, and the switch SW3 is disconnected. If the input voltage is greater, the processing transitions to a setting table 1 loading step S61, and if the input voltage is smaller, the processing transitions to a setting table 2 loading step S62. Hereinafter, as an example, a case in which the input voltage is smaller will be described.

When the processing has transitioned to the setting table 1 loading step S61, the integration unit and polarity setting table 2 is loaded, and thereafter, a rough adjustment negative conversion integration instance count kvn2, which is the number of instances of integration performed with the rough adjustment negative integration units, a rough adjustment positive conversion integration instance count kv2, which is the number of instances of integration with the rough adjustment positive integration unit, and a fine adjustment negative conversion integration instance count kv, which is the number of instances of integration with the fine adjustment negative integration unit, are obtained in accordance with the integration unit and polarity setting table 2, and kvn2, kv2, and kv are stored in a storage step S66. The following relational expression holds true between the input voltage and kvn2, kv2, and kv.

Math 37

$$Vin+|Vofcc|=VGn2c(kvn2+1)+VGp2c(kv2+1)+VGn1c(kv+\delta kv) \quad (59)$$

Although Vofcc differs depending on whether Vofc<0 or Vofc>0 holds true, upon considering the polarity of Vofc and the connection of the crossbar switch, |Vofcc| is the same in both the case where Vofc<0 holds true and the case where Vofc>0 holds true, and therefore the left side of formula (59) is Vin+|Vofcc|. VGn1cδkv on the right side of formula (59) indicates the difference between the sum of the input voltage and the offset voltage and the integration voltage immediately before the storage step, and δkv is a real number that is 0 or more, and less than 1, but the specific value thereof is unclear. Due to the uncertainty of δkv, the possible values of Vin have a range. The conversion value of Vin is determined by the median value of the range of Vin. The conversion value Vinc of Vin is indicated by formula (60).

Math 38

$$Vinc=VGn2c(kvn2+1)+VGp2c(kv2+1)+VGn1c(kv+\tfrac{1}{2})-|Vofcc| \quad (60)$$

If the input voltage is greater in the reference voltage comparison step S60 the integration unit and polarity setting table 1 is loaded, and therefore kv2 and kv are obtained in the processing up to the storage step. The conversion value of Vin in this case is the same as in formula (50).

The conversion value Vinc of the input voltage can be obtained using the calibration values VGn1c, VGp2c, VGn2c and Vofcc obtained in the calibration state through the above-described processing of the conversion control unit 42.

According to the embodiment indicated in the above description, even if the capacitance and the like forming the offset of the comparator 34 and the integration unit fluctuates due to change over time, it is possible to calibrate the offset of the comparator 34 and the integrating unit 55, which is the analog value output unit of the DA converter, and it is possible to provide an AD converter with high long-term stability.

Second Embodiment

Figure 13:
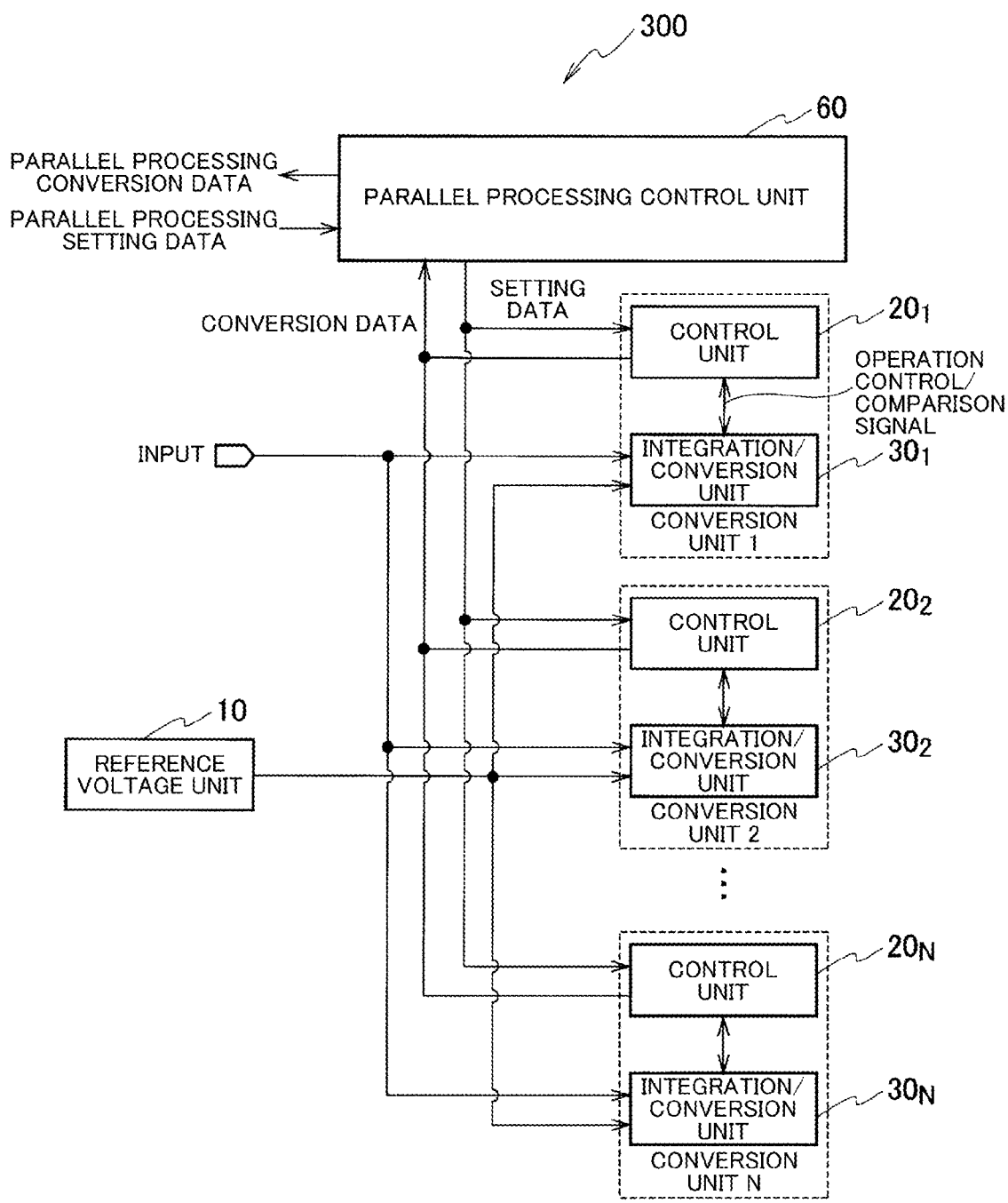
FIG. 13 is a functional block diagram showing an example of a configuration of a self-calibration-function-equipped AD converter according to a second embodiment of the present invention.

FIG. 13 shows a block diagram of an AD converter according to a second embodiment of the present invention. A self-calibration-function-equipped AD converter 300 shown in FIG. 13 is constituted by N conversion units 1 to N, a parallel processing control unit 60, and a reference voltage unit 10. The control unit 20* and the integration/conversion unit 30* of each conversion unit are respectively the same as the control unit 40* and the integration/conversion unit 50* of the first embodiment of the variation. Also, the operation control/comparison signal inside of the conversion unit indicates a bundle of signals that includes both the operation control signal and the comparison signal of the first embodiment or the variation.

In the parallel processing control unit 60, processing of the control unit of each conversion unit is controlled using setting data, conversion data including the calibration values of the integration units and the offset voltage and the digital value of the input voltage is received from the conversion unit that executed conversion processing, and the input voltage that was calibrated based on the digital value included in the conversion data is output as parallel processing conversion data.

If the conversion unit is constituted by, for example, the control unit and the integration/conversion unit of the AD converter of the embodiment shown in FIG. 1, 3, which is the number of processes performed in the calibration state, and 1, which is the number of processes performed in the conversion state, are added to obtain 4, which is the number of conversion units (N=4).

Figure 14:
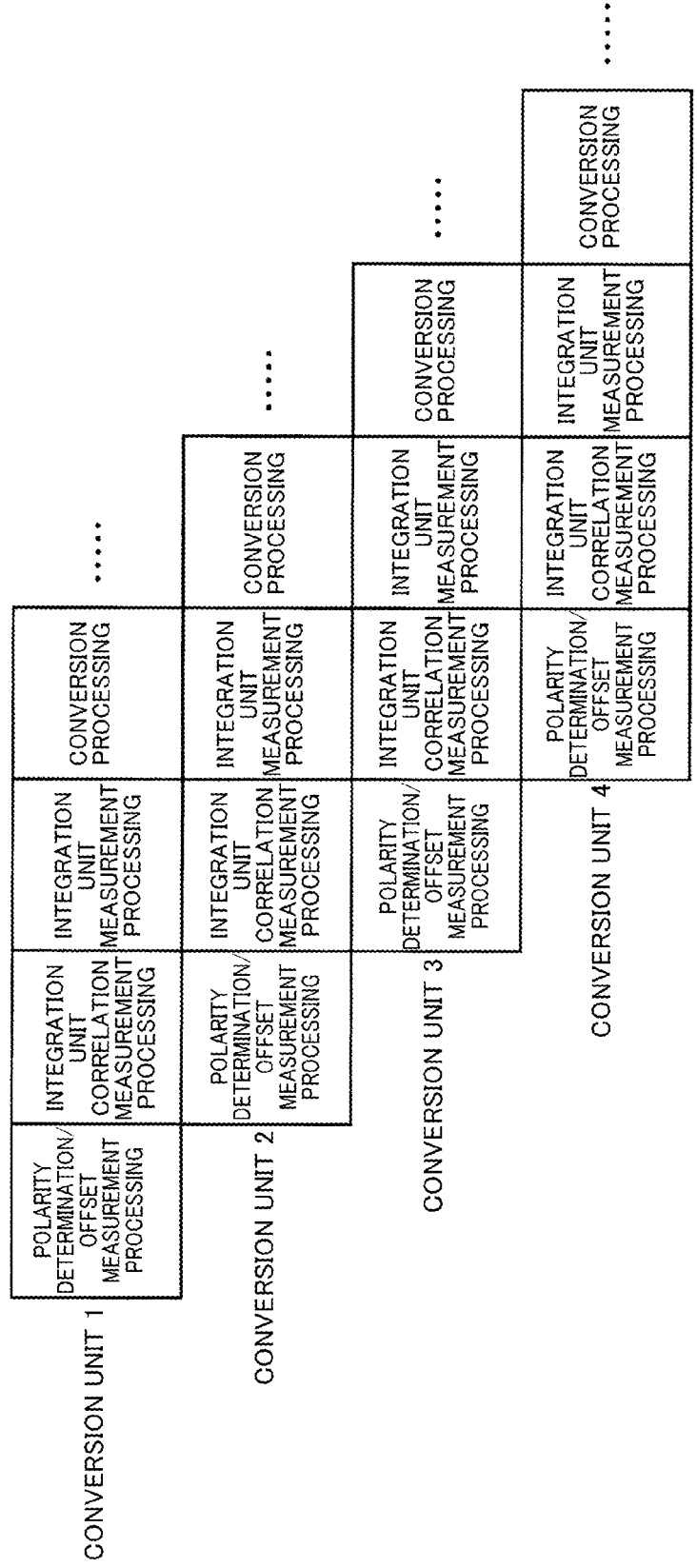
FIG. 14 is a diagram schematically showing a flow of processing of the self-calibration-function-equipped AD converter shown in FIG. 13.

FIG. 14 shows a diagram for illustrating a state of processing of each unit in this case. When the parallel processing control unit 60 receives parallel setting data including a command to start processing, the parallel processing control unit 60 transmits setting data including a command to start the calibration determination/offset measurement processing to the conversion unit 1. The conversion unit 1 starts the calibration determination/offset measurement processing When this processing is complete, the parallel processing control unit 60 transmits setting data including a command to start the integration unit correlation processing to the conversion unit 1, and transmits setting data including a command to start the calibration determination/offset measurement processing to the conversion unit 2. The conversion unit 1 starts the integration unit correlation processing and the conversion unit 2 starts the calibration determination/offset measurement processing. Hereinafter, due to the conversion units each carrying out the processing of the calibration state and the conversion processing in a manner such that the processing of the calibration state and the conversion processing is offset from that of the prior conversion unit by one step of processing, it is possible for the conversion units to sequentially and continuously implement the calibration and the conversion, and the conversion processing can be carried out by each conversion unit. For this reason, the conversion processing can be carried out continuously in the time unit of one process using a conversion unit that has already been calibrated.

In this manner, the self-calibration-function-equipped AD converter 300 according to the present embodiment includes conversion units 1 to N in which N above-described AD converters 100 and 200 with self-calibration functions are arranged side-by-side, and a parallel processing control unit 60 that performs control such that the operations of calibrating the AD converters 100 and 200 with self-calibration functions that calibrate the conversion units 1 to N, and the operations of converting the input voltages into digital signals are not synchronized with each other. Accordingly, the AD converter 300 with a self-calibration function can operate at a high speed.

The above-described self-calibration-function-equipped AD converter 100 is a self-calibration-function-equipped AD converter that does not require a measurement device for calibration. The self-calibration-function-equipped AD converter 100 includes the calibration control unit 21, the control unit 20, the reference voltage unit 10, the integrating unit 35, the comparator 34, and the integration conversion unit. Here, the calibration control unit 21 controls an operation of calibrating the self-calibration-function-equipped AD converter 100. The control unit 20 includes a conversion control unit 22 that controls an operation of converting an input voltage that is to be subjected to conversion into a digital signal. The reference voltage unit 10 outputs a reference voltage. The integrating unit 35 generates an integration voltage obtained by integrating two or more types of unit voltages. The comparator 34 has two inputs and compares the integration voltage and an input voltage or a reference voltage. The integration/conversion unit includes a crossbar switch 33 that switches the connection depending on whether the integration voltage is to be input to one input of the comparator 34 and the input voltage or reference voltage is to be input to the other input, or the input voltage or reference voltage is to be input to the one input of the comparator 34 and the integration voltage is to be input to the other input. Accordingly, it is possible to provide a self-calibration-function-equipped AD converter that does not require an external measurement device for calibration.

Also, the calibration control unit 21 includes the polarity determination/offset measurement processing unit 210, the integration unit measurement processing unit 212, and the integration unit correlation measurement unit 211. After pre-charging the integration voltage with a reference voltage, the polarity determination/offset measurement processing unit 210 determines the polarity of the offset voltage of the comparator 34 by switching the reference voltage and the integration voltage of the inputs of the comparator 34 using the crossbar switch 33 such that a low-potential voltage is output to the output of the comparator 34, obtains an integration instance count at which the integration voltage reaches the reference voltage, and measures the offset voltage of the comparator 34. After the integration voltage is discharged, the integration unit measurement processing unit 212 causes the comparator 34 to compare the reference voltage and the integration voltage, and measures the integration unit based on the integration instance count at which the integration voltage that exceeds the reference voltage is obtained. The integration unit correlation measurement unit 211 derives a relational expression between two types of integration units using the integration voltage obtained by integrating the unit voltage by the integration instance count obtained by adding an integer that is 1 or more to the integration instance count obtained by the polarity determination/offset measurement processing unit 210. Accordingly, it is possible to obtain $VGn1c$, $VGp2c$, and $Vofcc$, which are calibration values of the integration units $VGn1$ and $VGp2$ and the offset value $Vofc$ of the comparator.

Also, the polarity determination/offset measurement processing unit 210 determines the polarity of the offset value of the comparator 34. If the polarity is positive, the polarity determination/offset measurement processing unit 210 measures a first integration instance count at which the integration voltage obtained by integrating a rough adjustment positive integration unit with a positive polarity exceeds the reference voltage in the integrating unit 35. Thereafter, the polarity determination/offset measurement processing unit 210 measures a second integration instance count at which the integration voltage obtained by integrating a fine adjustment negative integration unit that has a negative polarity and a smaller absolute value than the rough adjustment positive integration unit exceeds the reference voltage. If the polarity is negative, the polarity determination/offset measurement processing unit 210 measures a first integration instance count at which the integration voltage obtained by integrating a rough adjustment negative integration unit with a negative polarity in the integrating unit 35 exceeds the reference voltage. Thereafter, the polarity determination/offset measurement processing unit 210 measures a second integration instance count at which the integration voltage obtained by integrating a fine adjustment positive integration unit that has a positive polarity and a smaller absolute value than the rough adjustment positive integration unit exceeds the reference voltage. Accordingly, it is possible to integrate the integration voltage up to a reference voltage or an input voltage with a lower integration instance count and a higher accuracy compared to the case of integrating with only a small integration unit.

The self-calibration-function-equipped AD converters 100, 200, and 300 according to the present embodiment can calibrate themselves through remote operation, without requiring a measurement device for calibration. Accordingly, the self-calibration-function-equipped AD converter of the present invention is suitable for use in combination with a large number of sensors located at a remote location.

That is, a worker can calibrate a large number of sensors through a remote operation without going out to the site at which the sensors are arranged.

Note that the present invention is not limited to the above-described embodiments, and modifications are possible within the range of the gist described in the claims.

REFERENCE SIGNS LIST 100, 200, 300 Self-calibration-function-equipped AD converter
10 Reference voltage unit
20, 40 Control unit
21, 41 Calibration control unit
22, 42 Conversion control unit
30, 50 Integration/conversion unit
31 Sample hold unit
32 Switching unit
33 Crossbar switch
34 Comparator
35, 55 Integrating unit
60 Parallel processing control unit
210 Polarity determination/offset measurement processing unit
211 Integration unit correlation measurement processing unit
212 Integration unit measurement processing unit
350 Positive current source
351 Negative current source
410 Multiplex integration unit measurement processing unit
550 Variable positive current source
551 Variable negative current source

The invention claimed is:

1. A self-calibration-function-equipped AD converter that does not require a measurement device for calibration, comprising:
  a control unit including a calibration control unit configured to control an operation of calibrating the self-calibration-function-equipped AD converter, and a conversion control unit configured to control an operation of converting an input voltage to be subjected to conversion into a digital signal;
  a reference voltage unit configured to output a reference voltage; and
  an integration/conversion unit including an integrating unit configured to generate an integration voltage obtained by integrating two or more types of unit voltages, a comparator that has two inputs and is configured to compare the integration voltage and the input voltage or the reference voltage, and a crossbar switch configured to switch a connection depending on whether the integration voltage is to be input to one input of the comparator and the input voltage or the reference voltage is to be input to another input, or the input voltage or the reference voltage is to be input to the one input of the comparator and the integration voltage is to be input to the other input.

2. A self-calibration-function-equipped AD converter, comprising:
  a conversion unit in which N self-calibration-function-equipped AD converters according to claim 1 are arranged side by side; and
  a parallel processing control unit configured to perform control such that an operation of calibrating the respective self-calibration-function-equipped AD converters that calibrate the conversion unit and an operation of converting an input voltage into a digital signal are not synchronized.

3. A self-calibration-function-equipped AD converter that does not require a measurement device for calibration, comprising:
  a control unit including a calibration control unit configured to control an operation of calibrating the self-calibration-function-equipped AD converter, and a conversion control unit configured to control an operation of converting an input voltage to be subjected to conversion into a digital signal;
  a reference voltage unit configured to output a reference voltage; and
  an integration/conversion unit including an integrating unit configured to generate an integration voltage obtained by integrating two or more types of unit voltages, a comparator that has two inputs and is configured to compare the integration voltage and the input voltage or the reference voltage, and a crossbar switch configured to switch a connection depending on whether the integration voltage is to be input to one input of the comparator and the input voltage or the reference voltage is to be input to another input, or the input voltage or the reference voltage is to be input to the one input of the comparator and the integration voltage is to be input to the other input,
  wherein the calibration control unit includes:
  a polarity determination/offset measurement processing unit configured to, after the integration voltage is pre-charged with the reference voltage, switch the reference voltage and the integration voltage of the inputs of the comparator using the crossbar switch such that a low-potential voltage is output to an output of the comparator, determine a polarity of an offset voltage of the comparator, and measure the offset voltage of the comparator by obtaining an integration instance count at which the integration voltage reaches the reference voltage;

an integration unit measurement processing unit configured to, after the integration voltage is discharged, cause the comparator to compare the reference voltage and the integration voltage, and measure an integration unit based on the integration instance count at which the integration voltage exceeding the reference voltage is obtained; and an integration unit correlation measurement unit configured to derive a relational expression between two types of integration units using an integration voltage obtained by integrating the unit voltage with an integration instance count obtained by adding an integer that is 1 or more to the integration instance count obtained by the polarity determination/offset measurement processing unit.

4. A self-calibration-function-equipped AD converter, comprising:
a conversion unit in which N self-calibration-function-equipped AD converters according to claim 3 are arranged side by side; and
a parallel processing control unit configured to perform control such that an operation of calibrating the respective self-calibration-function-equipped AD converters that calibrate the conversion unit and an operation of converting an input voltage into a digital signal are not synchronized.

5. A self-calibration-function-equipped AD converter that does not require a measurement device for calibration, comprising:
a control unit including a calibration control unit configured to control an operation of calibrating the self-calibration-function-equipped AD converter, and a conversion control unit configured to control an operation of converting an input voltage to be subjected to conversion into a digital signal;
a reference voltage unit configured to output a reference voltage; and
an integration/conversion unit including an integrating unit configured to generate an integration voltage obtained by integrating two or more types of unit voltages, a comparator that has two inputs and is configured to compare the integration voltage and the input voltage or the reference voltage, and a crossbar switch configured to switch a connection depending on whether the integration voltage is to be input to one input of the comparator and the input voltage or the reference voltage is to be input to another input, or the input voltage or the reference voltage is to be input to the one input of the comparator and the integration voltage is to be input to the other input,
wherein the calibration control unit includes:
a polarity determination/offset measurement processing unit configured to, after the integration voltage is pre-charged with the reference voltage, switch the reference voltage and the integration voltage of the inputs of the comparator using the crossbar switch such that a low-potential voltage is output to an output of the comparator, determine a polarity of an offset voltage of the comparator, and measure the offset voltage of the comparator by obtaining an integration instance count at which the integration voltage reaches the reference voltage;

an integration unit measurement processing unit configured to, after the integration voltage is discharged, cause the comparator to compare the reference voltage and the integration voltage, and measure an integration unit based on the integration instance count at which the integration voltage exceeding the reference voltage is obtained; and an integration unit correlation measurement unit configured to derive a relational expression between two types of integration units using an integration voltage obtained by integrating the unit voltage with an integration instance count obtained by adding an integer that is 1 or more to the integration instance count obtained by the polarity determination/offset measurement processing unit, wherein the polarity determination/offset measurement processing unit determines the polarity of the offset voltage of the comparator, and if the polarity is positive, measures a first integration instance count at which the integration voltage, which is obtained by integrating a rough adjustment positive integration unit with a positive polarity in the integrating unit, exceeds the reference voltage, and thereafter measures a second integration instance count at which the integration voltage, which is obtained by integrating a fine adjustment negative integration unit with a negative polarity and a smaller absolute value than the rough adjustment positive integration unit, exceeds the reference voltage, and if the polarity is negative, measures a first integration instance count at which the integration voltage, which is obtained by integrating a rough adjustment negative integration unit with a negative polarity in the integrating unit, exceeds the reference voltage, and thereafter measures a second integration instance count at which the integration voltage, which is obtained by integrating a fine adjustment positive integration unit with a positive polarity and a smaller absolute value than the rough adjustment positive integration unit, exceeds the reference voltage.

6. The self-calibration-function-equipped AD converter according to claim 5, wherein the rough adjustment positive integration unit and the rough adjustment negative integration unit respectively include a first integration unit voltage with a large absolute value and a second integration unit voltage with a smaller absolute value than the first integration unit voltage.

7. A self-calibration-function-equipped AD converter, comprising:
a conversion unit in which N self-calibration-function-equipped AD converters according to claim 5 are arranged side by side; and
a parallel processing control unit configured to perform control such that an operation of calibrating the respective self-calibration-function-equipped AD converters that calibrate the conversion unit and an operation of converting an input voltage into a digital signal are not synchronized.

8. A self-calibration-function-equipped AD converter, comprising:
a conversion unit in which N self-calibration-function-equipped AD converters according to claim 6 are arranged side by side; and a parallel processing control unit configured to perform control such that an operation of calibrating the respective self-calibration-function-equipped AD converters that calibrate the conversion unit and an operation of converting an input voltage into a digital signal are not synchronized.

* * * * *